(12) United States Patent
Gou et al.

(10) Patent No.: US 12,367,700 B2
(45) Date of Patent: Jul. 22, 2025

(54) ULTRASONIC SENSOR, METHOD FOR PREPARING ULTRASONIC SENSOR, AND DISPLAY APPARATUS

(71) Applicant: BOE TECHNOLOGY GROUP CO., LTD., Beijing (CN)

(72) Inventors: Yue Gou, Beijing (CN); Yingming Liu, Beijing (CN); Liang Cui, Beijing (CN); Xiufeng Li, Beijing (CN); Yanling Han, Beijing (CN); Yaqian Ji, Beijing (CN); Chenyang Zhang, Beijing (CN); Peixiao Li, Beijing (CN); Yuzhen Guo, Beijing (CN); Yingzi Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 728 days.

(21) Appl. No.: 17/776,638

(22) PCT Filed: May 31, 2021

(86) PCT No.: PCT/CN2021/097102
§ 371 (c)(1),
(2) Date: May 13, 2022

(87) PCT Pub. No.: WO2022/001538
PCT Pub. Date: Jan. 6, 2022

(65) Prior Publication Data
US 2022/0406086 A1    Dec. 22, 2022

(30) Foreign Application Priority Data
Jun. 30, 2020  (CN) .......................... 202010618891.2

(51) Int. Cl.
G06V 40/13    (2022.01)
H10N 30/30    (2023.01)
H10N 39/00    (2023.01)

(52) U.S. Cl.
CPC ....... G06V 40/1306 (2022.01); H10N 30/302 (2023.02); H10N 39/00 (2023.02)

(58) Field of Classification Search
CPC .. G06V 40/1306; H10N 30/302; H10N 39/00; H10N 30/045; H10N 30/857
See application file for complete search history.

(56) References Cited

U.S. PATENT DOCUMENTS

2017/0323133 A1* 11/2017 Tsai .................. G06V 40/1329
2020/0242316 A1*  7/2020 Liu ......................... G06F 3/017
2021/0216735 A1*  7/2021 Guo .................. G06V 40/1306

FOREIGN PATENT DOCUMENTS

CN    107229909 A  * 10/2017  ........... G06K 9/0002
CN    109829419 A  *  5/2019  ......... G06F 3/04164
(Continued)

OTHER PUBLICATIONS

English-language translation of the Written Opinion of the International Searching Authority for PCT/CN2021/097102. (Year: 2021).*

*Primary Examiner* — William P Fletcher, III
(74) *Attorney, Agent, or Firm* — Chiwin Law LLC

(57) ABSTRACT

An ultrasonic sensor, a preparation method of the ultrasonic sensor, and a display apparatus are provided. The ultrasonic sensor includes a texture recognition region and a contrast region. The contrast region is located on at least one side of the texture recognition region. The texture recognition region includes at least one recognizing unit, and the contrast region includes at least one contrast unit. The at least one recognizing unit includes a first dielectric material layer, and the at least one contrast unit includes a second dielectric material layer. The first dielectric material layer and the
(Continued)

second dielectric material layer are made of a same material. The first dielectric material layer exhibits piezoelectric properties. A piezoelectric strain constant of the first dielectric material layer is greater than a piezoelectric strain constant of the second dielectric material layer.

20 Claims, 22 Drawing Sheets

(56) References Cited

FOREIGN PATENT DOCUMENTS

| | | | | | |
|---|---|---|---|---|---|
| CN | 111326650 A | * | 6/2020 | ........... | H01L 41/257 |
| CN | 113869089 A | * | 12/2021 | ......... | G06V 40/1306 |
| WO | WO-2011005467 A2 | * | 1/2011 | ..... | A61B 17/320068 |

* cited by examiner

S110 — Forming a first portion for a first dielectric material layer and a second portion for a second dielectric material layer with a same material S120 — Polarizing at least the first portion such that the first portion is transformed into the first dielectric material layer having piezoelectric properties, and the second portion is formed into the second electrode layer

FIG. 18

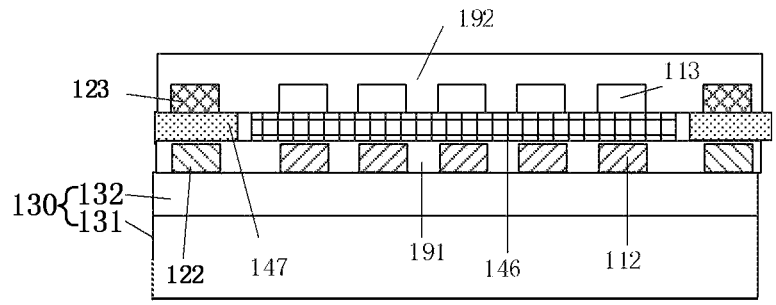

FIG. 19A

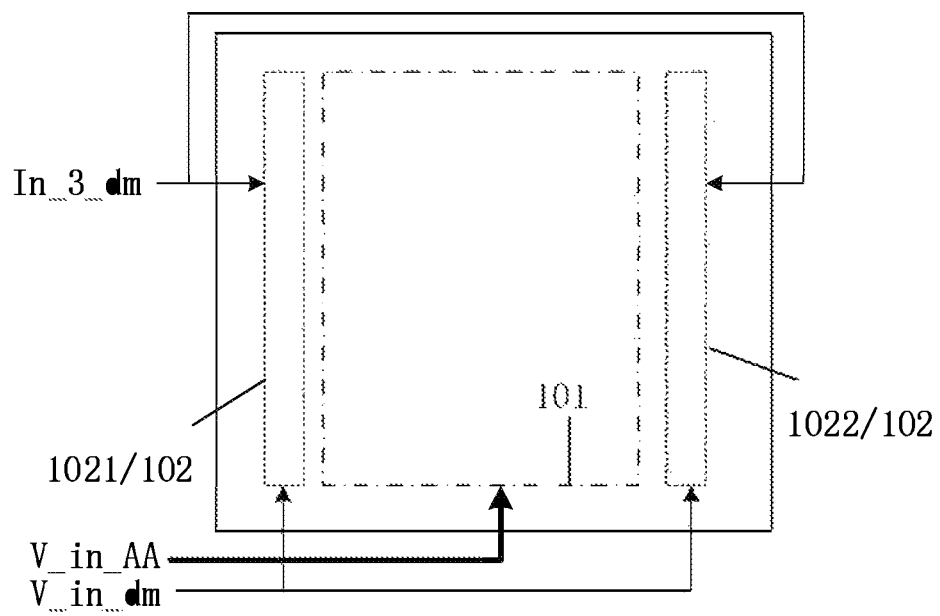

FIG. 19B

ULTRASONIC SENSOR, METHOD FOR PREPARING ULTRASONIC SENSOR, AND DISPLAY APPARATUS

CROSS REFERENCE TO RELATED APPLICATIONS

This application is a U.S. National Phase Entry of International Application No. PCT/CN2021/097102 filed on May 31, 2021, designating the United States of America and claiming priority to Chinese Patent Application No. 202010618891.2, filed on Jun. 30, 2020. The present application claims priority to and the benefit of the above-identified applications and the above-identified applications are incorporated by reference herein in their entirety.

TECHNICAL FIELD

Embodiments of the present disclosure relate to an ultrasonic sensor, a preparation method of the ultrasonic sensor, and a display apparatus.

BACKGROUND

An ultrasonic sensor takes advantage of reflection, refraction, diffraction, attenuation and other propagation characteristics of ultrasonic waves in a propagation medium (e.g., human tissue, steel, water, etc.) to infer shape, size and other information of a target. An ultrasonic sensor is a non-destructive testing means, and in some specific occasions, an ultrasonic sensor has unique advantages as compared with sensors based on technologies such as optics, electromagnetic wave, etc. Piezoelectric material is a material used for efficient excitation or generation of ultrasonic waves.

At present, fingerprint collecting devices based on the ultrasonic technology all utilize a principle of acoustic impedance difference between fingerprint valleys and ridges. Specifically, when ultrasonic waves excited by an ultrasonic wave emitting component reached a fingerprint surface through a propagation medium, since air presents in a position where a fingerprint valley is located, acoustic impedance at an interface corresponding to the fingerprint valley is seriously mismatched, which makes a vast majority (almost 100%) of ultrasonic energy reflected (by the interface); however, due to a better acoustic impedance matching situation of the interface corresponding to the fingerprint ridge, only a small amount of ultrasonic energy is reflected; the reflected ultrasonic waves are then transmitted through the propagation medium, and are converted by the ultrasonic wave receiving component into an electrical signal. After processing the electrical signal, a distribution image of the fingerprint valleys and ridges may be obtained.

SUMMARY

At least one embodiment of the present disclosure provides an ultrasonic sensor, which includes a texture recognition region and a contrast region. The contrast region is located on at least one side of the texture recognition region; the texture recognition region includes at least one recognizing unit, and the contrast region includes at least one contrast unit; the at least one recognizing unit includes a first dielectric material layer; the at least one contrast unit includes a second dielectric material layer; the first dielectric material layer and the second dielectric material layer are made of a same material; the first dielectric material layer exhibits piezoelectric properties; and a piezoelectric strain constant of the first dielectric material layer is greater than a piezoelectric strain constant of the second dielectric material layer.

For example, in at least one example of the ultrasonic sensor, a ratio of the piezoelectric strain constant of the first dielectric material layer to the piezoelectric strain constant of the second dielectric material layer is greater than or equal to 2.

For example, in at least one example of the ultrasonic sensor, the first dielectric material layer and the second dielectric material layer each includes a polyvinylidene fluoride film, and the polyvinylidene fluoride film included in the first dielectric material layer and the polyvinylidene fluoride film included in the second dielectric material layer present different polarization degrees.

For example, in at least one example of the ultrasonic sensor, the ultrasonic sensor further includes a backplane. An orthogonal projection of the second dielectric material layer on the backplane and an orthogonal projection of the first dielectric material layer on the backplane are spaced apart from each other.

For example, in at least one example of the ultrasonic sensor, the contrast region includes a first contrast sub-region and a second contrast sub-region; and the first contrast sub-region and the second contrast sub-region are located on both sides of the texture recognition region in a first direction.

For example, in at least one example of the ultrasonic sensor, the at least one recognizing unit further includes a first sub-electrode and a second sub-electrode; the first dielectric material layer is sandwiched between the first sub-electrode and the second sub-electrode in a direction perpendicular to the ultrasonic sensor; the at least one contrast unit further includes a third sub-electrode and a fourth sub-electrode; and the second dielectric material layer is sandwiched between the third sub-electrode and the fourth sub-electrode in the direction perpendicular to the ultrasonic sensor.

For example, in at least one example of the ultrasonic sensor, the first sub-electrode and the third sub-electrode are located in a first electrode layer; the second sub-electrode and the fourth sub-electrode are located in a second electrode layer; a shape and a size of the first sub-electrode and the third sub-electrode are the same; and a shape and a size of the second sub-electrode and the fourth sub-electrode are the same.

For example, in at least one example of the ultrasonic sensor, the ultrasonic sensor further includes a backplane, a first wiring and a second wiring. Both the first wiring and the second wiring are electrically connected with the fourth sub-electrode; the first wiring extends from a position electrically connected with the fourth sub-electrode to an edge of the backplane; and an orthogonal projection of an end portion of the second wiring on the backplane is spaced apart from the edge of the backplane.

For example, in at least one example of the ultrasonic sensor, the ultrasonic sensor further includes a third wiring, a fourth wiring, a fifth wiring and a sixth wiring. The third wiring is electrically connected with the first sub-electrode, and the fourth wiring is electrically connected with the third sub-electrode; the fifth wiring is electrically connected with the first sub-electrode, and the sixth wiring is electrically connected with the third sub-electrode; the third wiring extends from a position electrically connected with the first sub-electrode to the edge of the backplane; and the fourth wiring extends from a position electrically connected with the third sub-electrode to the edge of the backplane.

For example, in at least one example of the ultrasonic sensor, the ultrasonic sensor further includes a backplane, a seventh wiring and an eighth wiring. The seventh wiring is electrically connected with the first sub-electrode, and the eighth wiring is electrically connected with the first sub-electrode; the seventh wiring extends from the position electrically connected with the first sub-electrode to the edge of the backplane; and an orthogonal projection of an end portion of the eighth wiring on the backplane is spaced apart from the edge of the backplane.

For example, in at least one example of the ultrasonic sensor, the backplane includes at least one first pixel unit circuit and at least one second pixel unit circuit; the at least one first pixel unit circuit is respectively electrically connected with the first sub-electrode of the at least one recognizing unit; the at least one second pixel unit circuit is respectively electrically connected with the third sub-electrode of the at least one contrast unit; each of the at least one first pixel unit circuit and the at least one second pixel unit circuit includes a first voltage input terminal, a voltage output terminal, a driving transistor, and a first one-way ON circuit; the first one-way ON circuit includes a first terminal and a second terminal, a conduction direction of the first one-way ON circuit is from the first terminal of the first one-way ON circuit to the second terminal of the first one-way ON circuit; a control terminal of the driving transistor and the second terminal of the first one-way ON circuit are both electrically connected with the voltage output terminal; and the first terminal of the first one-way ON circuit and the first voltage input terminal are both electrically connected with a first node; the voltage output terminal of the at least one first pixel unit circuit is electrically connected with the first sub-electrode; the driving transistor of the at least one first pixel unit circuit is configured to be electrically connected with the first power terminal and to convert a voltage signal on the first sub-electrode into a current signal; the voltage output terminal of the at least one second pixel unit circuit is electrically connected with the third sub-electrode; the at least one first pixel unit circuit further includes a second voltage input terminal, and the second voltage input terminal of the at least one first pixel unit circuit is electrically connected with the first node; the seventh wiring is electrically connected with the second voltage input terminal of the at least one first pixel unit circuit; and the eighth wiring is electrically connected with the first voltage input terminal of the at least one first pixel unit circuit.

For example, in at least one example of the ultrasonic sensor, the ultrasonic sensor further includes a second one-way ON circuit and a third one-way ON circuit. The second one-way ON circuit includes a third terminal and a fourth terminal, and a conduction direction of the second one-way ON circuit is from the third terminal of the second one-way ON circuit to the fourth terminal of the second one-way ON circuit; the third one-way ON circuit includes a fifth terminal and a sixth terminal, and a conduction direction of the third one-way ON circuit is from the fifth terminal of the third one-way ON circuit to the sixth terminal of the third one-way ON circuit; the third terminal of the second one-way ON circuit is connected with the first node, and the fourth terminal of the second one-way ON circuit is connected with a second power terminal; the fifth terminal of the third one-way ON circuit is connected with a third power terminal, and the sixth terminal of the third one-way ON circuit is connected with the first node; and the second voltage input terminal of the at least one first pixel unit circuit is connected with the fifth terminal of the third one-way ON circuit.

At least one embodiment of the present disclosure further provides a display apparatus, which includes a display panel and the ultrasonic sensor according to at least one embodiment of the present disclosure, wherein, the display panel and the ultrasonic sensor are stacked in a direction perpendicular to the display apparatus.

For example, in at least one example of the display apparatus, the ultrasonic sensor is located on a non-light-emitting side of the display panel, and the display panel is an organic light-emitting diode display panel or a quantum dot display panel.

At least one embodiment of the present disclosure further provides a preparation method of an ultrasonic sensor, wherein, the ultrasonic sensor includes a texture recognition region and a contrast region; the contrast region is located on at least one side of the texture recognition region; the texture recognition region includes at least one recognizing unit; the contrast region includes at least one contrast unit; the at least one recognizing unit includes a first dielectric material layer; and the at least one contrast unit includes a second dielectric material layer. The method includes: forming a first portion for the first dielectric material layer and a second portion for the second dielectric material layer with a same material; polarizing at least the first portion such that the first portion is transformed into the first dielectric material layer which exhibits piezoelectric properties, and the second portion is formed into the second dielectric material layer, wherein, a piezoelectric strain constant of the first dielectric material layer is greater than a piezoelectric strain constant of the second dielectric material layer.

For example, in at least one example of the preparation method of the ultrasonic sensor, the polarizing at least the first portion includes: performing shielding process on the second portion while polarizing the first portion with a polarizing device, such that a polarization degree of the second portion is less than a polarization degree of the first portion.

For example, in at least one example of the preparation method of the ultrasonic sensor, the preparation method further includes forming a first electrode layer and a second electrode layer, wherein, the first electrode layer includes a first sub-electrode of the at least one recognizing unit and a third sub-electrode of the at least one contrast unit, and the second electrode layer includes a second sub-electrode of the at least one recognizing unit and a fourth sub-electrode of the at least one contrast unit; and wherein the forming a first portion for the first dielectric material layer and a second portion for the second dielectric material layer with a same material includes: forming a dielectric material layer on the first electrode layer with the same material, wherein, the dielectric material layer is located between the first electrode layer and the second electrode layer and includes the first portion and the second portion.

For example, in at least one example of the preparation method of the ultrasonic sensor, the polarizing at least the first portion includes: placing a laminate of the first electrode layer, the dielectric material layer and the second electrode layer in a polarizing device; configuring the polarizing device to form plasma to perform a polarization treatment on the first portion; and applying a shield voltage on the fourth sub-electrode to shield the plasma.

For example, in at least one example of the preparation method of the ultrasonic sensor, before or while the polarizing device is configured to form the plasma, the shield voltage is applied to the fourth sub-electrode.

For example, in at least one example of the preparation method of the ultrasonic sensor, the ultrasonic sensor further includes a backplane, a first wiring and a second wiring; the first wiring and the second wiring are both electrically connected with the fourth sub-electrode; the first wiring extends from a position electrically connected with the fourth sub-electrode to an edge of the backplane; an orthogonal projection of an end portion of the second wiring on the backplane is spaced apart from the edge of the backplane; and wherein the applying the shield voltage on the fourth sub-electrode includes: applying the shield voltage on the fourth sub-electrode with the first wiring.

For example, in at least one example of the preparation method of the ultrasonic sensor, the shield voltage is 10 V to 30 V.

For example, in at least one example of the preparation method of the ultrasonic sensor, the polarizing at least the first portion includes: applying a first voltage to the first sub-electrode, applying a second voltage to the second sub-electrode, wherein, a voltage difference between the first voltage and the second voltage is greater than 1000 V.

BRIEF DESCRIPTION OF THE DRAWINGS

In order to illustrate the technical solutions of the embodiments of the present disclosure more clearly, the accompanying drawings of the embodiments will be briefly introduced below. Apparently, the accompanying drawings in the following description only relate to some embodiments of the present disclosure, rather than limit the present disclosure.

FIG. 18 is an exemplary flow chart of a preparation method of an ultrasonic sensor provided by at least one embodiment of the present disclosure;

FIG. 19A is an exemplary cross-sectional view of a laminated structure of a backplane, a first electrode layer, a dielectric material layer, and a second electrode layer provided by at least one embodiment of the present disclosure;

FIG. 19B is an exemplary diagram of a first example of a polarization method provided by at least one embodiment of the present disclosure;

DETAILED DESCRIPTION

In order to make the objectives, technical solutions and advantages of the embodiments of the present disclosure more clear, the technical solutions in the embodiments of the present disclosure will be clearly and completely described below with reference to the accompanying drawings. Apparently, the described embodiments are only some of the embodiments of the present disclosure, but not all of the embodiments. Based on the embodiments of the present disclosure, all other embodiments obtained by those of ordinary skill in the art without creative efforts also fall within the protection scope of the present disclosure.

Unless otherwise defined, technical or scientific terms used herein shall have the ordinary meaning as understood by one of ordinary skilled in the art to which this disclosure belongs. As used in this disclosure, "first," "second," and similar terms do not denote any order, quantity, or importance, but are merely used to distinguish the various components. Likewise, a term such as "including" or "comprising" means that elements or things appearing before the term encompass elements or things recited after the term and their equivalents, but do not exclude other elements or things. A term such as "connected to" or "connected with" are not limited to physical or mechanical connections, but can include electrical connections, regardless directly or indirectly. Terms "up", "down", "left", "right", and the like are only used to represent the relative positional relationship, and when the absolute position of the described object changes, the relative positional relationship can also change accordingly.

Figure 1A:
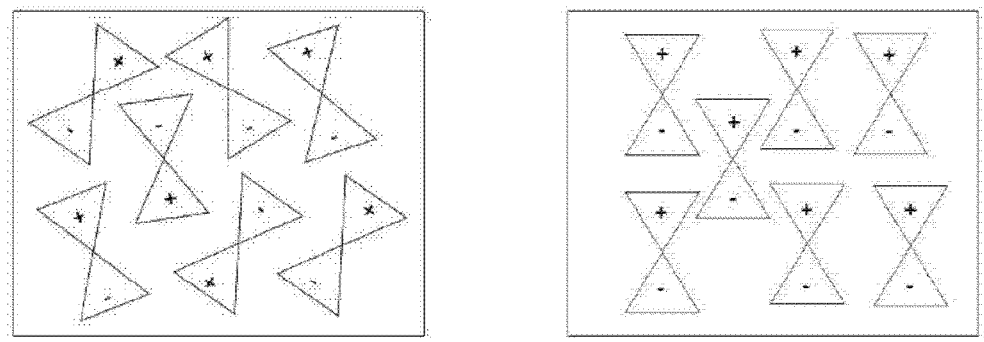
FIG. 1A shows arrangements of electric dipoles in a Polyvinylidene Fluoride (PVDF) film before and after polarization.

An inventor of the present disclosure notices in the study that a polyvinylidene fluoride film (a PVDF film) does not exhibit piezoelectric properties before polarization, which is caused by disordered arrangements of electric dipoles inside an unpolarized PVDF film (referring to a left panel of FIG. 1A). After the PVDF film is polarized, the PVDF film exhibits piezoelectric properties (e.g., which may exhibit a piezoelectric effect), because a purpose of polarizing the PVDF film is to make the electric dipoles inside the PVDF film have alignment tend to be uniform (i.e., highly aligned, referring to a right panel of FIG. 1A), whereby an intrinsic piezoelectric response may be generated inside the PVDF film after polarization treatment.

Figure 1B:
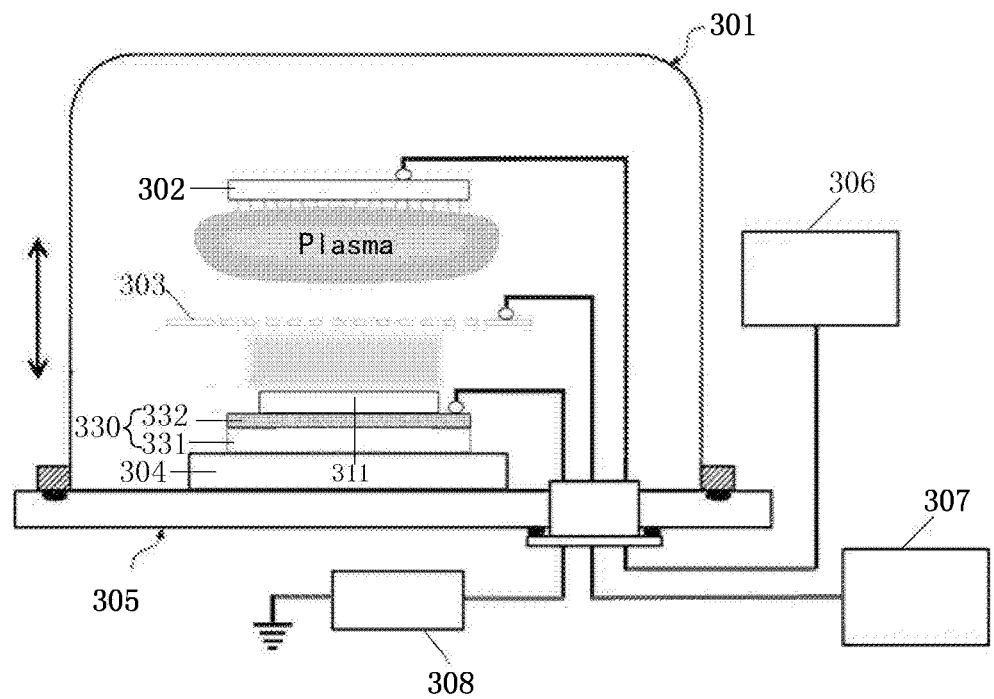
FIG. 1B shows an example of polarizing a polyvinylidene fluoride film with a polarizing device.

For example, a polyvinylidene fluoride film may be polarized with a polarizing device. FIG. 1B shows an example of polarizing a polyvinylidene fluoride film with a polarizing device. For example, as shown in FIG. 1B, the polarizing device includes a vacuum chamber 301, a discharge electrode 302, a grid electrode 303, a substrate heater 304, a metal platform 305, a discharge power supply 306 (with an output voltage of 10 kV to 50 kV), a grid power supply 307 (with an output voltage of 5 kV to 40 kV) and an electrometer 308.

For example, the polarizing device shown in FIG. 1B is an in-situ polarizing device. A principle of polarizing the polyvinylidene fluoride film (PVDF film) with the polarizing device shown in FIG. 1B is exemplarily described below.

For example, the polyvinylidene fluoride film may be polarized by using a method below. Firstly, a PVDF film 311 provided on the backplane 330 (including a substrate 331 and a circuit structure 332) is placed in a polarizing device. Secondly, a high-voltage electric field is formed between the discharge electrode 302 and the grid electrode 303, whereby the discharge electrode (i.e., a high-voltage source electrode) may ionize the air in a surrounding environment of the discharge electrode, and generate plasma; under an action of a potential difference between the discharge electrode (i.e., the high-voltage source electrode) and the grid electrode, the generated plasma moves to a surface of the PVDF thin film that has not been polarized, which, for example, causes the surface of the PVDF thin film to form oxidative polarizing groups, so that the disordered electric dipoles in the unpolarized PVDF thin film are aligned under an action of a high-voltage electric field, which makes the PVDF film polarized and exhibit piezoelectric properties.

Figure 1C:
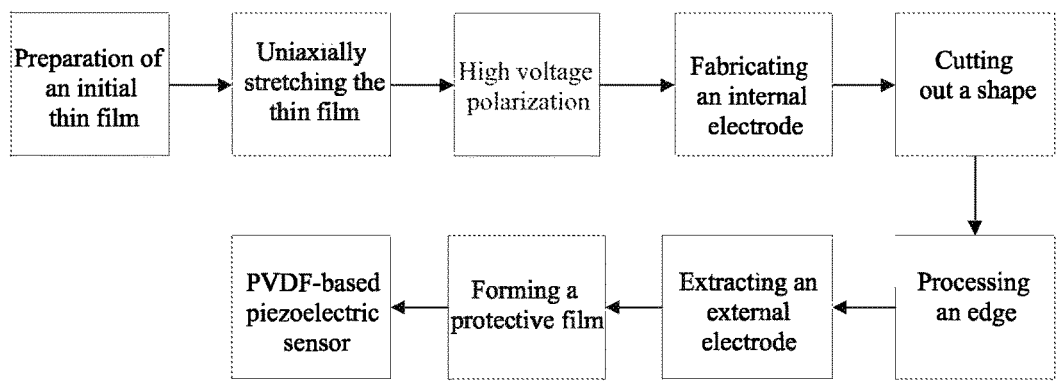
FIG. 1C shows a schematic flow chart of a preparation method of a PVDF-based piezoelectric sensor.

FIG. 1C shows a schematic flow chart of a preparation method of a PVDF-based piezoelectric sensor (or an ultrasonic sensor). For example, as shown in FIG. 1C, the preparation method of the PVDF-based piezoelectric sensor (or the ultrasonic sensor) includes step S511 to step S518 executed sequentially.

Step S511: preparing a PVDF thin film (i.e., preparing an initial thin film).

Step S512: uniaxially stretching the PVDF thin film.

Step S513: performing high voltage polarization on the stretched PVDF thin film.

Step S514: fabricating an internal electrode for the PVDF-based piezoelectric sensor.

Step S515: cutting out a shape of a laminated structure for fabricating the PVDF-based piezoelectric sensor.

Step S516: processing an edge of the laminated structure for fabricating the PVDF-based piezoelectric sensor.

Step S517: extracting an external electrode for the PVDF-based piezoelectric sensor.

Step S518: forming a protective film on the laminated structure for fabricating the PVDF-based piezoelectric sensor, thereby forming the PVDF-based piezoelectric sensor.

For example, in steps S511 to S518, the step S513 of performing high voltage polarization on the stretched PVDF thin film is a key processing step.

The inventor of the present disclosure notices in the study that a current ultrasonic-based fingerprint sensor (e.g., the PVDF-based piezoelectric sensor fabricated by using the method shown in FIG. 1C) output an electrical signal with a low signal-to-noise ratio, which will lead to the problem that a fingerprint pattern obtained based on the above-described electrical signal is quite different from a real fingerprint (i.e., the problem that a restoration degree of the fingerprint is poor or the fingerprint is unclear). Exemplary description will be given below in conjunction with FIG. 2A to FIG. 2D.

Figure 2A:
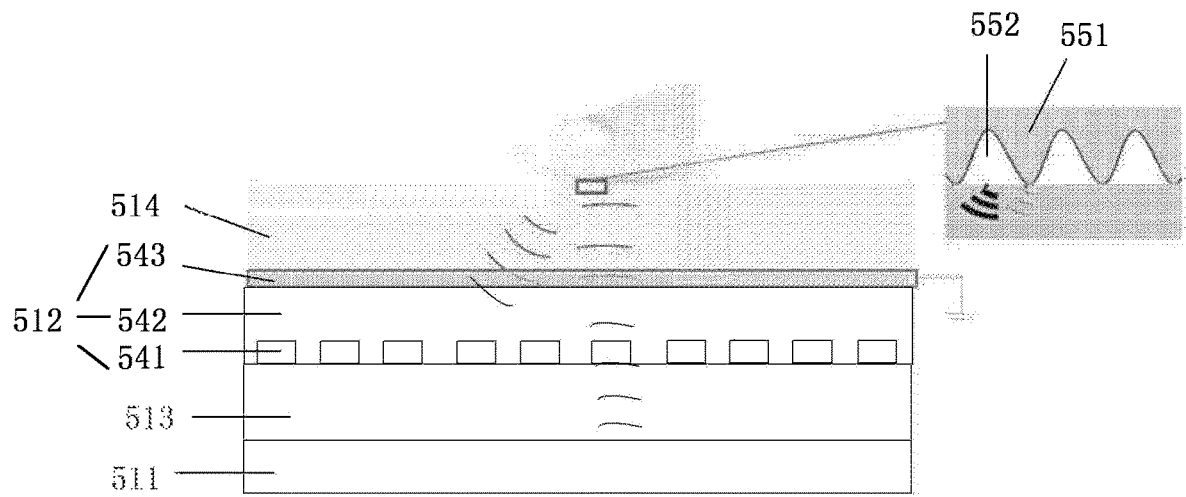
FIG. 2A is a cross-sectional schematic diagram of an ultrasonic-based fingerprint sensor.

FIG. 2A is a cross-sectional schematic diagram of an ultrasonic-based fingerprint sensor (e.g., an in-display fingerprint imaging sensor). For example, as shown in FIG. 2A, the ultrasonic-based fingerprint sensor includes an ultrasonic wave emitting component 511 and an ultrasonic wave receiving component 512 that are stacked on each other.

Figure 2B:
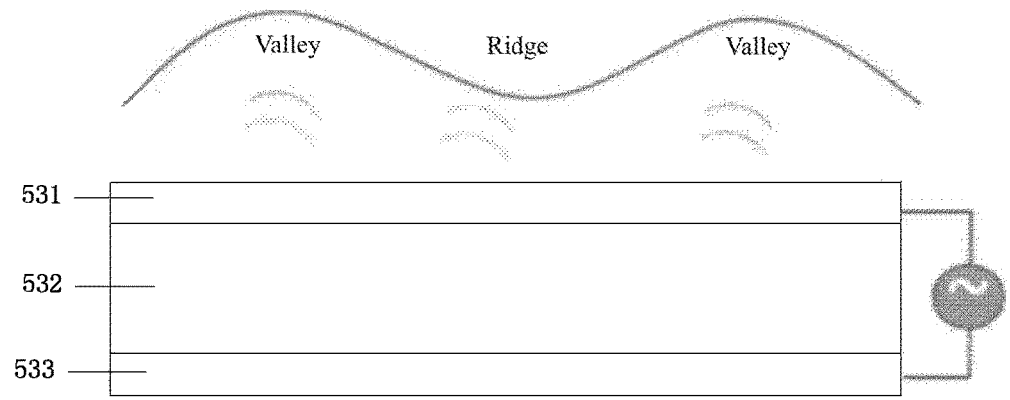
FIG. 2B is a cross-sectional schematic diagram of an ultrasonic wave emitting component shown in FIG. 2A.
Figure 2C:
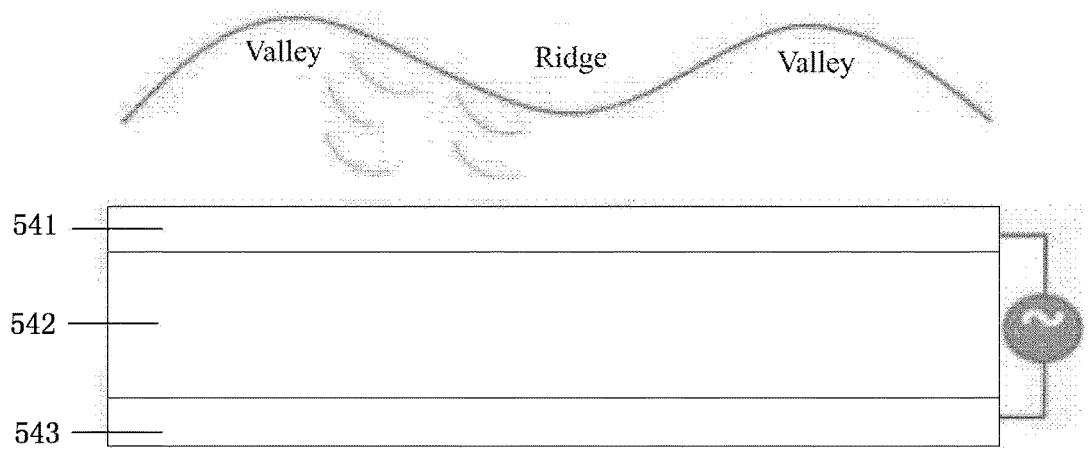
FIG. 2C is a cross-sectional schematic diagram of an ultrasonic wave receiving component shown in FIG. 2A.

FIG. 2B is a cross-sectional schematic diagram of the ultrasonic wave emitting component 511 shown in FIG. 2A; and FIG. 2C is a cross-sectional schematic diagram of the ultrasonic wave receiving component 512 shown in FIG. 2A. For example, as shown in FIG. 2B, the ultrasonic wave emitting component 511 includes a first electrode 531, a second electrode 533 and a first piezoelectric material layer 532 located between the first electrode 531 and the second electrode 533. For example, the ultrasonic wave receiving component 512 and the ultrasonic wave emitting component 511 may have similar structures. For example, as shown in FIG. 2C, the ultrasonic wave receiving component 512 includes a third electrode 541, a fourth electrode 543 and a second piezoelectric material layer 542 located between the third electrode 541 and the fourth electrode 543.

For example, as shown in FIG. 2A, the ultrasonic-based fingerprint sensor further includes a backplane 513; and the backplane 513 is configured to supply an electrical signal to at least one of the ultrasonic wave emitting component 511 and the ultrasonic wave receiving component 512. In some examples, the ultrasonic wave emitting component 511 and the ultrasonic wave receiving component 512 may each have a backplane, and no details will be repeated here. For example, as shown in FIG. 2A, the ultrasonic-based fingerprint sensor further includes a protective layer 514; and during operation, a user's finger is in contact with the protective layer 514.

For example, in an ultrasonic wave generation stage, the ultrasonic wave emitting component 511 is configured to transmit ultrasonic waves under an action of an alternating voltage; in an ultrasonic wave reception stage, the ultrasonic wave receiving component 512 is configured to receive ultrasonic waves and convert the received ultrasonic wave into an electrical signal.

An operation principle of the ultrasonic-based fingerprint sensor shown in FIG. 2A will be described below, that is, a principle that the ultrasonic wave emitting component 511 reflects ultrasonic waves and the ultrasonic wave receiving component 512 converts the received ultrasonic waves into an electrical signal.

For example, as shown in FIG. 2B, the first electrode 531 and the second electrode 533 included in the ultrasonic wave emitting component 511 are configured to receive an Alternating Current voltage (AC voltage). For example, a voltage difference between the first electrode 531 and the second electrode 533 included in the ultrasonic wave emitting component 511 may be made to be an AC voltage. For example, a ground voltage is supplied to the first electrode 531 and an AC voltage is supplied to the second electrode 533. For example, under an action of the AC voltage, the first piezoelectric material layer 532 may deform and vibrate. For example, the first piezoelectric material layer 532 vibrates in a direction in which the first electrode 531 and the second electrode 533 are opposite to each other, so that the ultrasonic wave emitting component 511 may generate and output ultrasonic waves.

As shown in FIG. 2A, during operation, the ultrasonic waves generated by the ultrasonic wave emitting component 511 is transmitted toward the protective layer 514; when the ultrasonic waves being transmitted to the fingerprint in contact with the protective layer 514, the ultrasonic waves are reflected by the fingerprint. For example, as shown in FIG. 2A, there is air 552 between a valley of the fingerprint and the protective layer, and a ridge of the fingerprint is in contact with the protective layer. For example, as shown in FIG. 2A, the ridge and the valley of the fingerprint have different reflectivity to the ultrasonic wave generated by the ultrasonic wave emitting component 511 and transmitted toward finger skin 551, that is, energy of the ultrasonic waves reflected by the ridge of the fingerprint is different from energy of the ultrasonic waves reflected by the valley of the fingerprint. For example, as shown in FIG. 2A, the energy of the ultrasonic waves reflected by the ridge of the fingerprint is less than the energy of the ultrasonic waves reflected by the valley of the fingerprint.

As shown in FIG. 2A, during operation, the ultrasonic waves reflected by the fingerprint are incident on the ultrasonic wave receiving component 512, and cause the second piezoelectric material layer 542 of the ultrasonic wave receiving component 512 vibrate (e.g., vibrate in a direction in which the third electrode 541 and the fourth electrode 543 are opposite to each other); the second piezoelectric material layer 542 of the ultrasonic wave receiving component 512 converts the vibration into an electrical signal (e.g., an AC voltage); since reflected energy is different between the ridge and the valley of the fingerprint, ultrasonic waves incident to different regions of the ultrasonic wave receiving component 512 have different intensities, different regions of the ultrasonic wave receiving component 512 have different vibration amplitudes, correspondingly, different regions of the second piezoelectric material layer 542 have different vibration amplitudes, and different regions of the second piezoelectric material layer 542 output electrical signals (AC voltages) with different intensities (e.g., average intensities); thus, fingerprint recognition may be performed based on intensity distribution of the output electrical signals (AC voltages). For example, after processing the electrical signals, a distribution image of valleys and ridges of the fingerprint may be obtained.

The inventor of the present disclosure notices in the study that, a piezoelectric strain constant D33 of the piezoelectric material (e.g., at least one of the first piezoelectric material layer 532 and the second piezoelectric material layer 542) in the ultrasonic-based fingerprint sensor shown in FIG. 2A is usually less. For example, in order to integrate the ultrasonic-based fingerprint sensor into a display screen (i.e., subjected to constraints of in-display integration of the display screen), the piezoelectric material of ultrasonic-based fingerprint sensor is mostly a polyvinylidene fluoride (PVDF) thin film; due to limitations of a relevant preparation process, the piezoelectric strain constant D33 of the PVDF thin film is usually less than or equal to 25. This leads to at least one of the intensity of the ultrasonic wave generated by the ultrasonic wave emitting component 511 and the intensity of the AC voltage signal output by the ultrasonic wave receiving component 512 is small, and thus a signal for characterizing distribution of valleys and ridges in the electrical signal output by the ultrasonic-based fingerprint sensor is weak.

The inventor of the present disclosure also notices in the study that, an electrical signal received and processed by electrical components (e.g., a detecting circuit and a pixel unit circuit) of an ultrasonic-based fingerprint sensor or a fingerprint detecting system including an ultrasonic-based fingerprint sensor inevitably contains noise. Therefore, the electrical signal received by the electrical components include an available signal (e.g., a signal for characterizing valley-ridge distribution) and a noise signal (RMS), wherein, the noise signal includes an electrical noise caused by the pixel unit circuit and an electrical noise caused by the detecting circuit.

Figure 2D:
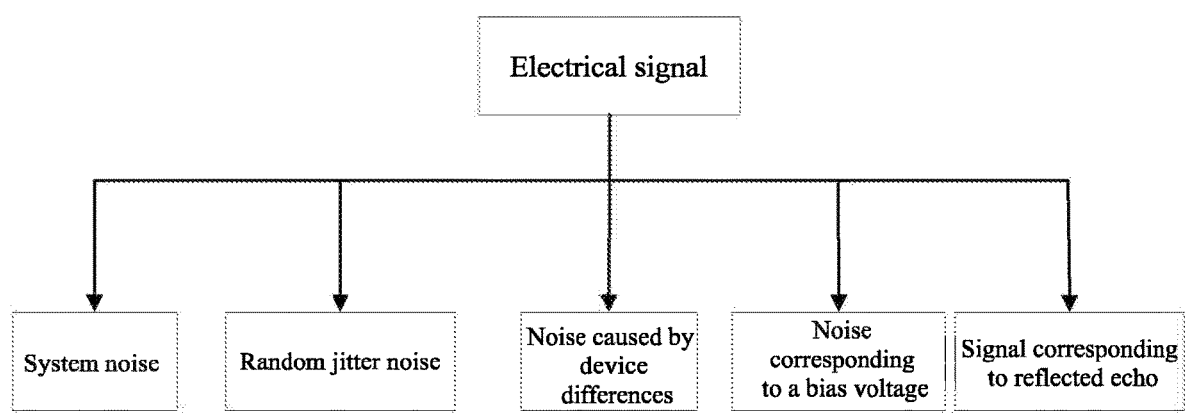
FIG. 2D shows a schematic diagram of composition of an electrical signal output by an ultrasonic-based fingerprint sensor.

FIG. 2D shows a schematic diagram of composition of an electrical signal output by an ultrasonic-based fingerprint sensor. For example, as shown in FIG. 2D, the electrical signal output by the ultrasonic-based fingerprint sensor includes system noise (including a noise caused by a system or an apparatus of the ultrasonic-based fingerprint sensor), a noise caused by random jitter, a noise caused by device differences, a noise corresponding to a bias voltage (or quiescent operating point voltage) and a signal corresponding to reflected echo (ultrasonic waves reflected by the fingerprint back to the ultrasonic-based fingerprint sensor); here, only the signal corresponding to the reflected echo is an available signal (e.g., the signal for characterizing distribution of valleys and ridges). For example, the electrical signal output by the ultrasonic-based fingerprint sensor may also include a noise caused by environmental factors (e.g., temperature changes).

Because the signal for characterizing distribution of valleys and ridges in the electrical signal output by the ultrasonic-based fingerprint sensor is weak and the electrical signal received by the electrical component also includes various noises, for example, an electrical noise caused by the pixel unit circuit and an electrical noise caused by the detecting circuit, the signal-to-noise ratio of the electrical signal output by the ultrasonic-based fingerprint sensor shown in FIG. 2A is low, which may degrade the quality of the fingerprint image output by the ultrasonic-based fingerprint sensor (i.e., a restoration degree of the fingerprint is poor or the fingerprint is unclear).

At least one embodiment of the present disclosure provides an ultrasonic sensor, a preparation method of the ultrasonic sensor, and a display apparatus. The ultrasonic sensor includes a texture recognition region (e.g., a fingerprint recognition region or a palmprint recognition region) and a contrast region. The contrast region is located on at least one side of the texture recognition region; the texture recognition region includes at least one recognizing unit (e.g., a fingerprint recognizing unit), the contrast region includes at least one contrast unit; the at least one recognizing unit includes a first dielectric material layer (e.g., a piezoelectric material layer); at least one contrast unit includes a second dielectric material layer; the first dielectric material layer and the second dielectric material layer are made of a same material; the first dielectric material layer exhibits piezoelectric properties; and a piezoelectric strain constant of the first dielectric material layer is greater than a piezoelectric strain constant of the second dielectric material layer.

For example, by providing a contrast region on at least one side of the texture recognition region (e.g., the fingerprint recognition region or the palmprint recognition region), and making the piezoelectric strain constant of the first dielectric material layer included in the recognizing unit in the texture recognition region greater than the piezoelectric strain constant of the second dielectric material layer included in the contrast unit in the contrast region, when the electrical signal output by the recognizing unit is processed, the electrical signal output by the contrast unit may be taken as at least portion of the noise in the electrical signal output by the recognizing unit and for deducting, to acquire an electrical signal from which at least a portion of the noise has been deducted. For example, the above-described electrical signal from which at least a portion of the noise has been deducted may be used as raw data or pre-processed data for subsequent processing (e.g., converting the electrical signal into a fingerprint image). For example, since the noise in the electrical signal from which at least a portion of the noise has been deducted is reduced, quality (e.g., clarity of the image) of an image (e.g., a fingerprint image) acquired based on the above-described electrical signal from which at least a portion of the noise has been deducted may be improved.

For example, as compared with a solution in which there is no dielectric material layer (e.g., second dielectric material layer) provided in the contrast region (e.g., the dielectric material layer formed in the contrast region is removed by using a patterning process), by making the piezoelectric strain constant of the first dielectric material layer in the texture recognition region greater than the piezoelectric strain constant of the second dielectric material layer in the contrast region, an electrical structure of the contrast region is more similar to an electrical structure of the texture recognition region, so that a noise value of the contrast unit is made closer to a noise value of the recognizing unit, which, thus, may further improve quality of the image (e.g., the fingerprint image) acquired based on the electrical signal from which at least a portion of the noise has been deducted.

In some examples, the above-described ultrasonic sensor is an ultrasonic-based fingerprint imaging sensor, and adopts PVDF to form the piezoelectric material of the ultrasonic-based fingerprint imaging sensor. For example, by changing at least design of the backplane circuit (e.g., at least one of wirings and the pixel unit circuit included in the backplane) of the fingerprint recognizing sensor, an electrode layer (e.g., at least one of the first electrode layer and the second electrode layer as described below) of the sensor may be multiplexed in a process of fabricating the above-described ultrasonic-based fingerprint imaging sensor layer to only polarize a first portion of PVDF without actively polarizing a second portion of PVDF (e.g., omitting polarizing the second portion of PVDF), thereby making piezoelectric properties of the first portion of PVDF being greater than piezoelectric properties of the second portion of PVDF, and forming a recognizing unit of the sensor that is located in the texture recognition region (i.e., a region including the above-described first portion of PVDF) and a contrast unit located in the contrast region (i.e., a region including the above-described second portion of PVDF). For example, PVDF included in the contrast unit does not have a piezoelectric effect, but has semiconductor properties, so PVDF included in the contrast unit can neither emit an ultrasonic signal nor convert the received ultrasonic signal into an electrical signal; however, the contrast unit may output a noise caused by an ultrasonic excitation signal (e.g., a TX excitation signal) applied to the contrast region and a noise caused by other factor as an electrical signal, and the electrical signal output by the contrast unit may be taken as at least a portion of the noise of the electrical signal output by the recognizing unit (e.g., the noise of the contrast unit is coupled to the recognizing unit); and thus, a difference between the electrical signal output by the recognizing unit and the electrical signal output by the contrast unit may be taken as the electrical signal from which at least a portion of the noise has been deducted and used as raw data or preprocessed data for subsequent processing (e.g., converting the electrical signal into the fingerprint image). For example, since the noise (e.g., the electrical noise) in the above-described electrical signal from which at least a portion of the noise has been deducted is reduced, quality of an image (e.g., a fingerprint image) acquired based on the above-described electrical signal from which at least a portion of the noise has been deducted may be improved.

For example, the sensor may output the above-described electrical signal from which at least a portion of the noise has been deducted, to supply to a processing apparatus of a detecting system (e.g., a fingerprint detecting system) including the above-described sensor, so that the processing apparatus (e.g., a processor) may acquire an image (e.g., a fingerprint image) based on the above-described electrical signal from which at least a portion of the noise has been deducted.

For example, by taking a difference between the electrical signal output by the recognizing unit and the electrical signal output by the contrast unit as the electrical signal from which at least a portion of the noise has been deducted, at least a portion of the system noise and random jitter noise of the sensor may be removed. For example, the above-described system noise may be noise or interference caused by an electronic system or a circuit (e.g., at least one of the pixel unit circuit and the detecting circuit). For example, in a case where the ultrasonic excitation electrical signal received by the recognizing unit has jitter, an intensity of the ultrasonic wave output by the recognizing unit may also have jitter, and correspondingly, the electrical signal output by the recognizing unit will also have jitter (assuming other noise remain unchanged); by using the contrast unit to output the noise caused by the ultrasonic excitation signal applied to the contrast region and the noise caused by other factors in a form of electrical signal, quality (e.g., clarity of the image) of an image (e.g., a fingerprint image) acquired based on the above-described electrical signal from which at least a portion of the noise has been deducted may be improved.

For example, the above-described ultrasonic-based fingerprint imaging sensor may be integrated in a display apparatus and provided on a non-display side of the display panel of the display apparatus, that is, the ultrasonic-based fingerprint imaging sensor may be used as at least a portion of an in-display fingerprint detecting system. For example, by taking the difference between the electrical signal output by the recognizing unit and the electrical signal output by the contrast unit as the electrical signal from which at least a portion of the noise has been deducted, system noise and random jitter of the received signal may be suppressed, and a signal-to-noise ratio of the system may be improved; for example, post-processing of the circuit may effectively reduce a circuit noise of the in-display fingerprint detecting system, so as to further at least partially solve the problems of low signal-to-noise ratio and poor fingerprint restoration of current in-display fingerprint recognition.

The ultrasonic sensor provided by the embodiments of the present disclosure will be described below in a non-limiting manner through several examples and embodiments. As described below, different features in these specific examples and embodiments may be combined with each other without conflict, thus, new examples and embodiments can be obtained, which also belong to the protection scope of the present disclosure.

Figure 3A:
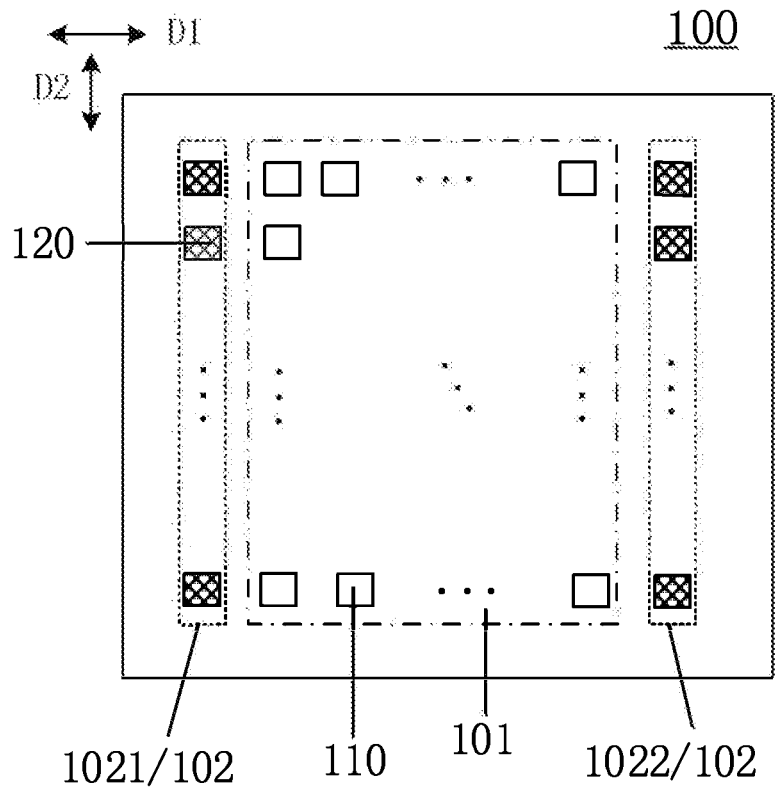
FIG. 3A is a schematic plan view of an ultrasonic sensor provided by at least one embodiment of the present disclosure.

FIG. 3A is a schematic plan view of an ultrasonic sensor 100 provided by at least one embodiment of the present disclosure. For example, the ultrasonic sensor 100 may be implemented as a sensor for fingerprint detection, for example, the ultrasonic sensor 100 may be a fingerprint imaging sensor, a palmprint imaging sensor, or other suitable sensors.

It should be noted that, for convenience of description, the ultrasonic sensor 100 provided by at least one embodiment of the present disclosure is exemplarily described below by taking that the sensor is implemented as a fingerprint imaging sensor, but embodiments of the present disclosure are not limited thereto.

For example, as shown in FIG. 3A, the ultrasonic sensor 100 includes a texture recognition region 101 and a contrast region 102, the contrast region 102 is located on at least one side of the texture recognition region 101; the texture recognition region 101 includes at least one recognizing unit 110, and the contrast region 102 includes at least one contrast unit 120. For example, the texture recognition region 101 and the contrast region 102 are arranged side by side in the first direction D1. For example, the contrast region 102 may include a first contrast sub-region 1021 and a second contrast sub-region 1022.

For example, as shown in FIG. 3A, the texture recognition region 101 includes a plurality of recognizing units 110; and the plurality of recognizing units 110 are arranged, for example, in an array. For example, as shown in FIG. 3A, the contrast region 102 includes a plurality of contrast units 120, and the plurality of contrast units 120 are, for example, arranged in one or more columns. For example, a fingerprint image may be acquired at least based on an electrical signal output by at least some recognizing units 110 of the plurality of recognizing units 110.

For example, a center-to-center distance between adjacent recognizing units 110 in the same texture recognition region 101 is 60 microns to 90 microns (e.g., 75 microns), and a center-to-center distance between a recognizing unit 110 and a contrast unit 120 adjacent to each other is greater than or equal to the center-to-center distance between adjacent recognizing units 110 in the same texture recognition region 101. For example, when the center-to-center distance between adjacent recognizing units 110 in the same texture recognition region 101 is 75 microns, the center-to-center distance between a recognizing unit 110 and a contrast unit 120 adjacent to each other is greater than or equal to 75 microns.

Figure 3B:
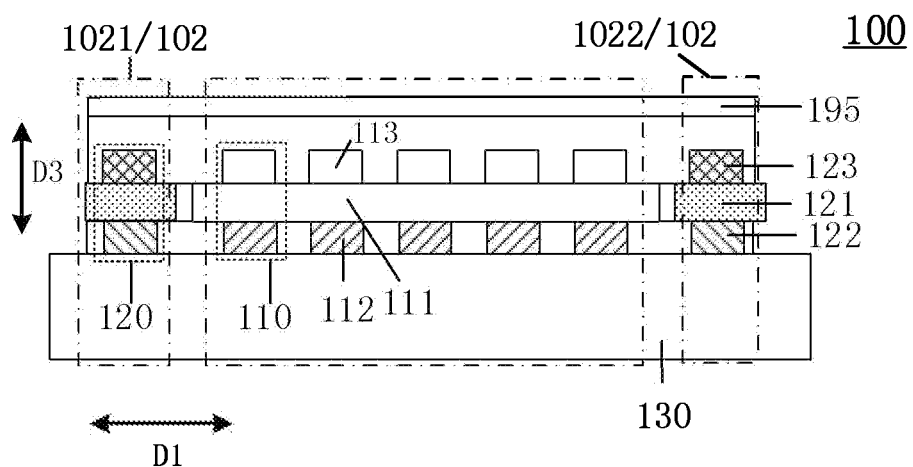
FIG. 3B is a cross-sectional schematic diagram of an ultrasonic sensor provided by at least one embodiment of the present disclosure.

For example, at least one (e.g., each) of the plurality of recognizing units 110 includes a first dielectric material layer 111 (not shown in FIG. 3A, referring to FIG. 3B); and at least one (e.g., each) of the plurality of contrast units 120 includes a second dielectric material layer 121 (not shown in FIG. 3A, referring to FIG. 3B).

In some examples, the recognizing unit 110 may not only be used for emitting ultrasonic waves, but also may convert the ultrasonic waves reflected by the fingerprint and incident on the above-described laminated structure into an electrical signal. For example, the first dielectric material layer 111 converts a voltage loaded on the first dielectric material layer 111 into mechanical motion based on a piezoelectric effect to generate ultrasonic waves; based on the piezoelectric effect, the first dielectric material layer 111 converts the mechanical motion caused by the reflected ultrasonic waves which are reflected by the fingerprint and incident on the recognizing unit 110 into an electrical signal. For example, the above-described recognizing unit 110 implements the functions of transmitting the ultrasonic waves and converting the ultrasonic waves into an electrical signal in a time-sharing manner. For example, since the second dielectric material layer 121 of the contrast unit 120 is not polarized or has a small degree of polarization, the contrast unit 120 cannot convert the ultrasonic waves incident on the contrast unit 120 into an electrical signal (such as an available signal), or may convert the ultrasonic waves incident on the contrast unit 120 into a weak electrical signal (an available signal), and therefore, the electrical signal output by the contrast unit 120 is mainly noise.

FIG. 3B is a cross-sectional schematic diagram of an ultrasonic sensor 100 provided by at least one embodiment of the present disclosure. For example, as shown in FIG. 3B, at least one fingerprint recognizing unit 110 further includes a first sub-electrode 112 and a second sub-electrode 113; the first dielectric material layer 111 is sandwiched between the first sub-electrode 112 and the second sub-electrode 113 in a direction perpendicular to the ultrasonic sensor 100. At least one contrast unit 120 further includes a third sub-electrode 122 and a fourth sub-electrode 123; and the second dielectric material layer 121 is sandwiched between the third sub-electrode 122 and the fourth sub-electrode 123 in the direction perpendicular to the ultrasonic sensor 100 (i.e., the third direction D3).

For example, as shown in FIG. 3B, the first dielectric material layer 111 and the second dielectric material layer 121 are located in a same layer; the first sub-electrode 112 and the third sub-electrode 122 are located in a same layer (e.g., the first electrode layer); and the second sub-electrode 113 and the fourth sub-electrode 123 are located in a same layer (e.g., the second electrode layer).

For example, the first dielectric material layer 111 and the second dielectric material layer 121 being located in a same layer refers to that the first dielectric material layer 111 and the second dielectric material layer 121 are formed of a same material by using a same patterning process, and the first dielectric material layer 111 and the second dielectric material layer 121 are in contact with a same film layer. For example, other "being located in a same layer" involved in at least one embodiment of the present disclosure also have same or similar meaning, and no details will be repeated here.

For example, by making the first dielectric material layer 111 and the second dielectric material layer 121 located in a same layer, the first sub-electrode 112 and the third sub-electrode 122 located in a same layer, and the second sub-electrode 113 and the fourth sub-electrode 123 located in a same layer, electrical structures of the texture recognition region 101 and the contrast region 102 may be closer, such that a noise value of at least one contrast unit 120 is made closer to a noise value of at least one recognizing unit 110, which, thus, may further improve quality of the image (e.g., the fingerprint image) acquired based on the electrical signal from which at least a portion of the noise has been deducted.

For example, as shown in FIG. 3B, in a case where the texture recognition region 101 includes a plurality of recognizing units 110, the first dielectric material layers 111 included in the plurality of recognizing units 110 may be connected with each other (e.g., there is no interface between first dielectric material layers 111 included in adjacent recognizing units 110), the first sub-electrodes 112 included in the plurality of recognizing units 110 are arranged at intervals from each other, and the second sub-electrodes 113 included in the plurality of recognizing units 110 are arranged at intervals from each other, but the embodiments of the present disclosure are not limited thereto.

For example, as shown in FIG. 3B, in a case where the contrast region 102 includes a plurality of contrast units 120, the second dielectric material layers 121 included in the plurality of contrast units 120 may be connected with each other (e.g., there is no interface between the second dielectric material layers 121 included in adjacent contrast units 120), the third sub-electrodes 122 included in the plurality of contrast units 120 are arranged at intervals from each other, and the fourth sub-electrodes 123 included in the plurality of contrast units 120 are arranged at intervals from each other, but the embodiments of the present disclosure are not limited thereto.

Figure 3C:
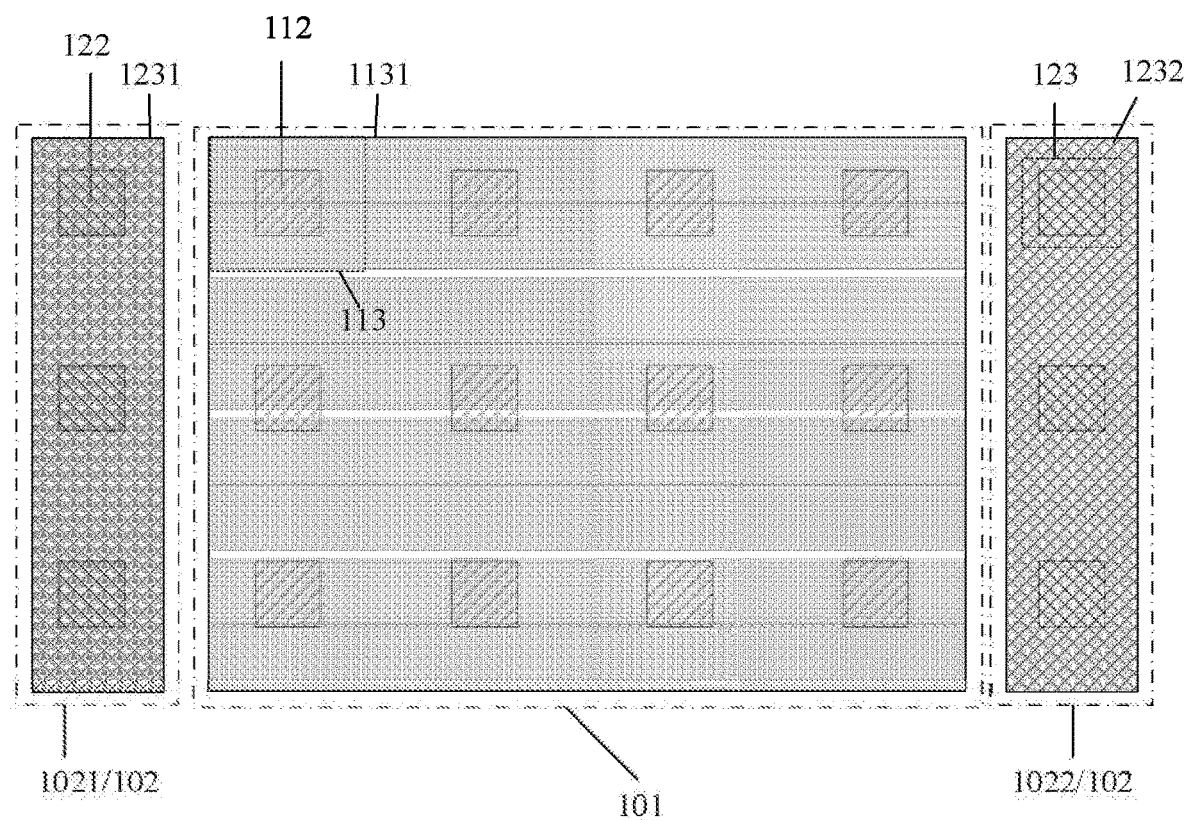
FIG. 3C is a schematic plan view of a first sub-electrode to a fourth sub-electrode of an ultrasonic sensor provided by at least one embodiment of the present disclosure.

In one example, as shown in FIG. 3C, the second sub-electrodes 113 included in the plurality of recognizing units 110 may also be connected with each other, that is, there is no interface or seam between adjacent second sub-electrodes 113, thereby reducing the number of wirings. In this case, the second sub-electrodes 113 included in the plurality of recognizing units 110 constitute a complete first common electrode 101; an orthogonal projection of the first common electrode 101 on the backplane respectively at least partially overlap with the orthogonal projections of the first sub-electrodes 112 included in the plurality of recognizing units 110 on the backplane. For example, the orthogonal projection of the first common electrode 101 on the backplane completely covers the orthogonal projections of the first sub-electrodes 112 included in some of (e.g., all) recognizing units 110 on the backplane.

In the above-described example, as shown in FIG. 3C, the fourth sub-electrodes 123 included in the plurality of contrast units 120 located in a same contrast sub-region (e.g., the first contrast sub-region 1021 or the second contrast sub-region 1022) may also be connected with each other, that is, there is no interface or seam between adjacent fourth sub-electrodes 123; and they are electrically connected with each other, thereby reducing the number of wirings. In this case, the fourth sub-electrodes 123 included in the plurality of contrast units 120 in the contrast sub-region (e.g., the first contrast sub-region 1021 and the second contrast sub-region 1022) constitute a complete second common electrode (e.g., the second common electrodes 1231 and 1232). An orthogonal projection of the second common electrode 1231 on the backplane respectively at least partially overlaps with the orthogonal projections of the third sub-electrodes 122 included in the plurality of recognizing units 110 on the backplane in the corresponding contrast sub-regions. For example, the orthogonal projection of the second common electrode 1231 on the backplane completely covers the orthogonal projections of the third sub-electrodes 122 included in some of (e.g., all) contrast units 120 of the corresponding contrast sub-regions.

Figure 3D:
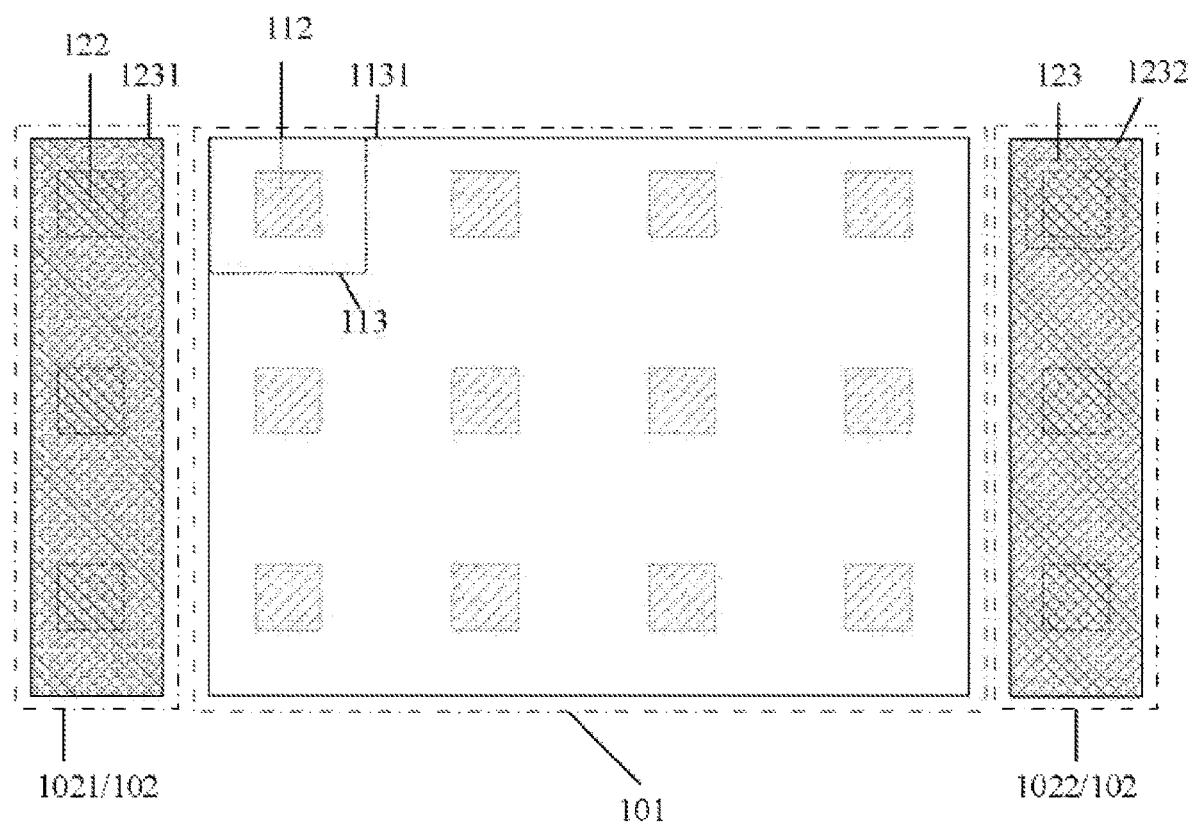
FIG. 3D is another schematic plan view of a first sub-electrode to a fourth sub-electrode of an ultrasonic sensor provided by at least one embodiment of the present disclosure.

In another example, as shown in FIG. 3D, the second sub-electrodes 113 included in the plurality of recognizing units 110 may also be connected with each other and located in a same contrast sub-region (e.g., the first contrast sub-region 1021, the second contrast sub-region 1022); and the second sub-electrodes 113 and the adjacent fourth sub-electrodes 123 are connected with each other, that is, the second sub-electrodes 113 included in the plurality of recognizing units 110 and the fourth sub-electrodes 123 included in the plurality of contrast units 120 jointly constitute a complete common electrode. For example, an orthogonal projection of the above-described common electrode 1133 on the backplane completely covers the orthogonal projections of the first sub-electrodes 112 included in some of (e.g., all) recognizing units 110 on the backplane and the orthogonal projections of the third sub-electrodes 122 included in some of (e.g., all) contrast units 120 on the backplane.

In yet another example, the fourth sub-electrodes 123 included in the plurality of contrast units 120 located in a same contrast sub-region (e.g., the first contrast sub-region 1021 and the second contrast sub-region 1022) are connected with each other; and the second sub-electrodes 113 included in the adjacent recognizing units 110 are spaced apart from each other.

Figure 3E:
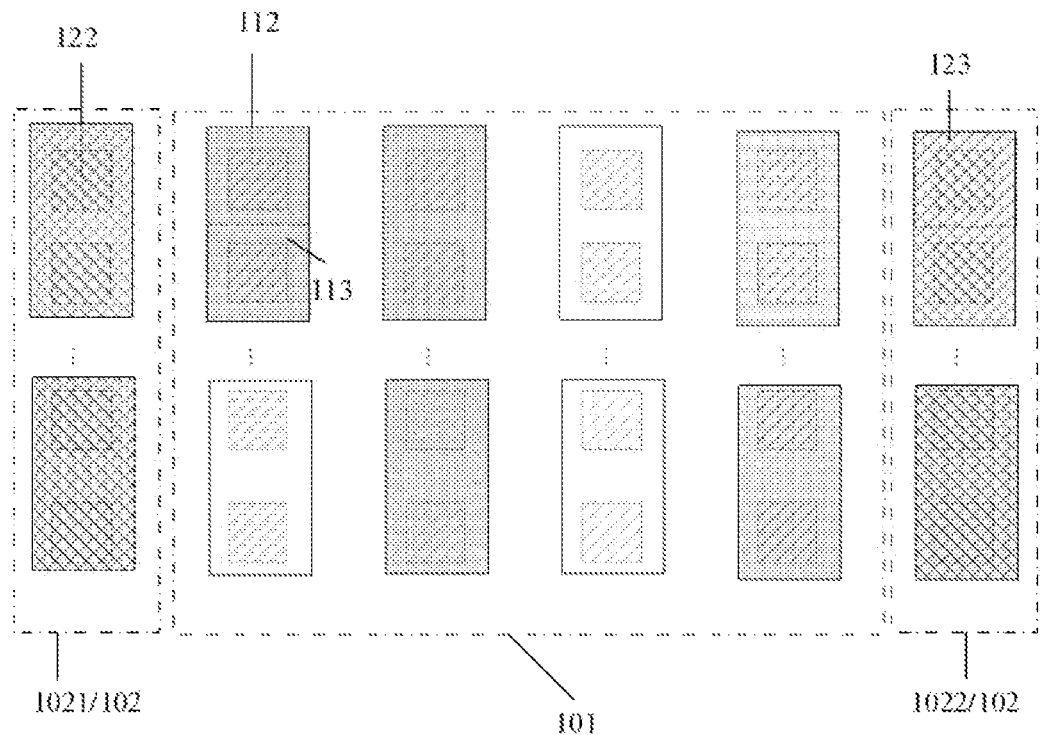
FIG. 3E is still another schematic plan view of a first sub-electrode to a fourth sub-electrode of an ultrasonic sensor provided by at least one embodiment of the present disclosure.

In yet another example, as shown in FIG. 3E, second sub-electrodes 113 of two adjacent recognizing units 110 (e.g., two adjacent in a column direction) in the texture recognition region 101 are connected with each other; and fourth sub-electrodes 123 included in the two adjacent contrast units 120 in the contrast sub-region are connected with each other. For example, an orthogonal projection of an electrode formed by second sub-electrodes 113 included in two adjacent recognizing units 110 (e.g., adjacent two in the column direction) that are connected with each other on the backplane completely covers orthogonal projections of first sub-electrodes 112 included in the above-described two adjacent recognizing units 110 on the backplane. For example, an orthogonal projection of an electrode formed by fourth sub-electrodes 123 included in two adjacent contrast units 120 that are connected with each other on the backplane completely covers orthogonal projections of third sub-electrodes 122 included in the above-described two adjacent contrast units 120 on the backplane.

In yet another example, second sub-electrodes 113 of three, four or other suitable number of recognizing units 110 that are adjacent to each other (e.g., adjacent in the column direction or a row direction) in the texture recognition region 101 are connected with each other, and fourth sub-electrodes 123 included in three, four or other suitable number of contrast units 120 that are adjacent to each other (e.g., adjacent in the column direction or the row direction) in the contrast sub-region are connected with each other. For example, an orthogonal projection of an electrode formed by mutually connected second sub-electrodes 113 of the three, four or other suitable number of recognizing units 110 that are adjacent to each other on the backplane completely covers an orthogonal projection of an electrode formed by the above-described mutually connected first sub-electrodes 112 included in the three, four or other suitable number of recognizing units 110 that are adjacent to each other on the backplane. For example, an orthogonal projection of an electrode formed by mutually connected fourth sub-electrodes 123 included in the three, four or other suitable number of contrast units 120 that are adjacent to each other on the backplane completely covers an orthogonal projection of an electrode formed by the above-described mutually connected third sub-electrodes 122 included in the three, four or other suitable number of contrast units 120 that are adjacent to each other on the backplane, and no details will be repeated here.

For example, the first dielectric material layer 111 exhibits piezoelectric properties (e.g., piezoelectric effect). In this case, the first dielectric material layer 111 may also be referred to as a piezoelectric material layer. For example, since the first dielectric material layer 111 exhibits piezoelectric properties (e.g., the piezoelectric effect), in a process of being deformed by an external force (e.g., in a case of receiving ultrasonic waves reflected by the fingerprint), charges of opposite signs occur on opposite surfaces of the first dielectric material layer 111 (e.g., two opposite surfaces of the first dielectric material layer 111 in the third direction shown in FIG. 3B). That is, the first dielectric material layer 111 may convert the received ultrasonic signal into an electrical signal. Since the quantity of charges on the surfaces of the first dielectric material layer 111 is related to a magnitude of the external force (e.g., the intensity of the ultrasonic waves reflected by the fingerprint), the charges on the opposite surfaces of the first dielectric material layer 111 may be collected to acquire an intensity of the ultrasonic waves incident on the first dielectric material layer 111. For example, the two opposite surfaces of the first dielectric material layer 111 in the third direction shown in FIG. 3B are respectively in direct contact with the first sub-electrode 112 and the second sub-electrode 113. In this case, charges generated by the first dielectric material layer 111 may be collected as the electrical signal output by the recognizing unit 110 via at least one of the first sub-electrode 112 and the second sub-electrode 113 (for example, via the first sub-electrode 112).

For example, the piezoelectric strain constant of the first dielectric material layer 111 is greater than the piezoelectric strain constant of the second dielectric material layer 121, For example, the greater the piezoelectric strain constant of the dielectric material, the greater the response to pressure; that is, when a force applied to the dielectric material remains constant, the greater the piezoelectric strain constant of the dielectric material, the greater the quantity of charges generated by the dielectric material, and correspondingly, the greater the intensity of the available signal in the electrical signal output by the dielectric material. Therefore, by making the piezoelectric strain constant of the first dielectric material layer 111 in the texture recognition region 101 greater than the piezoelectric strain constant of the second dielectric material layer 121 in the contrast region 102, an intensity of the available signal in the electrical signal output by the recognizing unit 110 may be made greater than an intensity of the available signal in the electrical signal output by the contrast unit 120. In this case, when the electrical signal output by the recognizing unit 110 is processed, the electrical signal output by the contrast unit 120 may be taken as at least portion of the noise in the electrical signal output by the recognizing unit 110 and being deducted, to acquire an electrical signal from which at least a portion of the noise has been deducted. For example, the above-described electrical signal from which at least a portion of the noise has been deducted may be used as raw data or pre-processed data for subsequent processing (e.g., converting the electrical signal into a fingerprint image). For example, since the noise in the electrical signal from which at least a portion of the noise has been deducted is reduced, quality of an image (e.g., a fingerprint image) acquired based on the above-described electrical signal from which at least a portion of the noise has been deducted may be improved.

For example, a signal-to-noise ratio of the above-described electrical signal from which at least a portion of the noise has been deducted refers to SNR=SS/SN, where, SS is the available signal in the electrical signal output by the recognizing unit 110, and the electrical signal output by the recognizing unit 110 may be, for example, read via a fifth wiring 145 (referring to FIG. 7 below) electrically connected with the first sub-electrode 112. For example, the available signal in the above-described electrical signal from which at least a portion of the noise has been deducted may be taken as the available signal in the electrical signal output by the recognizing unit 110. SN is the noise signal in the above-described electrical signal from which at least a portion of the noise has been deducted, and the noise signal in the above-described electrical signal from which at least a portion of the noise has been deducted is equal to a difference between the noise signal in the texture recognition region 101 and the noise signal in the contrast region 102. For example, the noise signal of the contrast region 102 may be acquired based on the electrical signal output by the contrast unit 120; for example, the electrical signal output by the contrast unit 120 may be, for example, read via a sixth wiring 146 electrically connected with the third sub-electrode 122 (referring to FIG. 7 below).

For example, if the electrical signal output by the contrast unit 120 is close enough to the noise in the electrical signal output by the recognizing unit 110, the noise signal SN in the above-described electrical signal from which at least a portion of the noise has been deducted is close to zero; in this case, even if the contrast unit 120 exhibits weak piezoelectric properties and generates a small amount of available signals, since the value of this SS approaches zero, the signal-to-noise ratio SNR of the above-described electrical signal from which at least a portion of the noise has been deducted may also meet practical application requirements.

For example, the inventor of the present disclosure notices through testing that the signal-to-noise ratio may be improved by arranging the contrast region 102 on at least one side of the texture recognition region 101, which will be exemplified below.

For example, the inventor of the present disclosure notices that 8 columns of recognizing units 110 included in a sensor sample have a valley-ridge signal amount of about 400 and a noise of about 30; and in this case, the signal-to-noise ratio is about 13; if an electrical signal output by 4 columns of recognizing units 110 included in the sensor sample is deducted from an electrical signal (e.g., an average value of the electrical signals) output by adjacent 4 columns of contrast units 120, and the noise signal of the electrical signal from which at least a portion of the noise has been deducted is changed to 20, then the signal-to-noise ratio increases to about 20, so that the signal-to-noise ratio may be improved by providing the contrast region 102 on at least one side of the texture recognition region 101.

In one example, the second dielectric material layer 121 may not exhibit piezoelectric properties (e.g., a piezoelectric effect), that is, the piezoelectric strain constant of the second dielectric material layer 121 is zero; correspondingly, after receiving the ultrasonic signal (i.e., after suffer to pression), the second dielectric material layer 121 does not convert the ultrasonic signal into an electrical signal (i.e., cannot generate charges with opposite signs on opposite surfaces of the second dielectric material layer 121 in the third direction); in this case, the intensity of the available signal of the electrical signal output by the contrast unit 120 is zero, that is, the electrical signals output by the contrast unit 120 are all noise signals; in this case, after the electrical signal output by the contrast unit 120 is taken as at least portion of the noise in the electrical signal output by the recognizing unit 110 and deducted, the intensity of the acquired available signal (e.g., an available signal that may be used to characterize distribution of valleys and ridges) in the electrical signal from which at least a portion of the noise has been deducted is not reduced, so that quality of an image (e.g., a fingerprint image) acquired based on the above-described electrical signal from which at least a portion of the noise has been deducted may be further improved.

It should be noted that, the piezoelectric strain constant of the second dielectric material layer 121 is not limited to be equal to zero; the inventor of the present disclosure notices in the study that, even if the piezoelectric strain constant of the second dielectric material layer 121 is not equal to zero, in a case where a ratio of the piezoelectric strain constant of the first dielectric material layer 111 to the piezoelectric strain constant of the second dielectric material layer 121 is greater than or equal to 2 (e.g., greater than or equal to 2.5), the ultrasonic sensors provided by at least one embodiment of the present disclosure can improve quality of an image (e.g., a fingerprint image) acquired based on the above-described electrical signal from which at least a portion of the noise has been deducted. Exemplary description will be given below with reference to FIG. 4A.

Figure 4A:
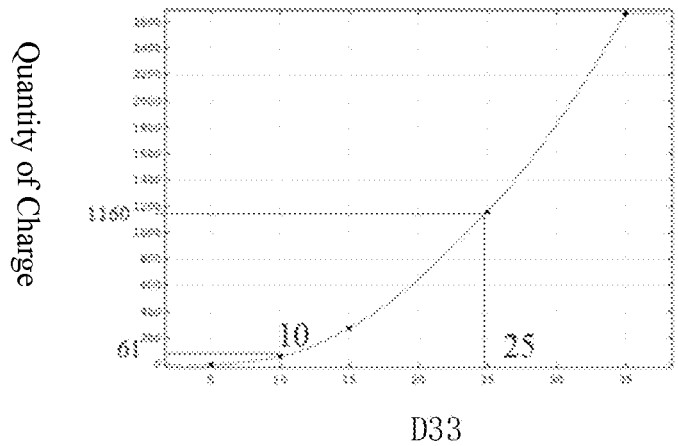
FIG. 4A shows a relationship between an intensity of an available signal of the ultrasonic sensor including a piezoelectric material and a piezoelectric strain constant of the piezoelectric material.

FIG. 4A shows a relationship between the intensity of the available signal (the quantity of charge corresponding to the available signal) of the ultrasonic sensor 100 including the piezoelectric material and the piezoelectric strain constant D33 of the piezoelectric material.

For example, as shown in FIG. 4A, the intensity of the available signal (i.e., the quantity of charge corresponding to the available signal) of the ultrasonic sensor 100 including the piezoelectric material is exponentially related to a value of the piezoelectric strain constant D33 of the piezoelectric material. For example, as shown in FIG. 4A, when the piezoelectric strain constants D33 of the piezoelectric materials are respectively 25 and 10, the quantity of charge output by the ultrasonic sensor 100 including the piezoelectric material is respectively 1160 and 61; in this case, a ratio of the quantity of charge output by the ultrasonic sensor 100 including the piezoelectric material whose D33 is equal to 25 to that output by the ultrasonic sensor 100 including the piezoelectric material whose D33 is equal to 10 is approximately equal to 19.

Therefore, when the ratio of the piezoelectric strain constant of the first dielectric material layer 111 to the piezoelectric strain constant of the second dielectric material layer 121 is greater than or equal to 2 (e.g., greater than or equal to 2.5), the intensity of the available signal in the electrical signal output by the contrast unit 120 is relatively small (e.g., negligible), and the ultrasonic sensor 100 provided by at least one embodiment of the present disclosure may improve quality of an image (e.g., a fingerprint image) acquired based on the above-described electrical signal from which at least a portion of the noise has been deducted.

For example, as shown in FIG. 3A and FIG. 3B, the contrast region 102 may include a first contrast sub-region 1021 and a second contrast sub-region 1022; and the first contrast sub-region 1021 and the second contrast sub-region 1022 are located on both sides of the texture recognition region 101 in the first direction D1. For example, as shown in FIG. 3A and FIG. 3B, in a case where the contrast region 102 includes the first contrast sub-region 1021 and the second contrast sub-region 1022, the electrical signal output by the plurality of contrast units 120 included in the first contrast sub-region 1021 may be taken as at least a portion of a noise value of recognizing units 110 located in a left half of the texture recognition region, and the electrical signal output by the plurality of contrast units 120 included in the second contrast sub-region 1022 may be taken as at least a portion of a noise value of recognizing units 110 in a right half of the texture recognition region. Since the electrical signal output by the plurality of contrast units 120 included in the first contrast sub-region 1021 is closer to the noise value of the recognizing units 110 located in the left half of the texture recognition region, and the electrical signal output by the plurality of contrast units 120 included in the second contrast sub-region 1022 is closer to the noise value of the recognizing units 110 located in the right half of the texture recognition region, thus, by making the first contrast sub-region 1021 and the second contrast sub-region 1022 located on both sides of the texture recognition region 101 in the first direction D1, quality of an image (e.g., a fingerprint image) acquired based on the above-described electrical signal from which at least a portion of the noise has been deducted may be further improved. For example, an electrical signal output by contrast units 120 located in an xth row of the first contrast sub-region 1021 is taken as at least portion of a noise value of recognizing units 110 located in a left half of the xth row of the texture recognition region; here, the plurality of recognizing units 110 are arranged in m rows, and the plurality of contrast units 120 are arranged in m rows.

For example, the first direction D1 may be the row direction of the ultrasonic sensor 100, and the second direction D2 may be the column direction of the ultrasonic sensor 100; during operation of the ultrasonic sensor 100, recognizing units 110 located in different rows sequentially output electrical signals generated by converting ultrasonic waves, that is, in the column direction of the ultrasonic sensor 100, the plurality of recognizing units 110 output electrical signals row by row. For example, the first direction D1, the second direction D2, and the third direction D3 intersect with each other (e.g., are perpendicular to each other).

For example, with respect to the example shown in FIG. 3A, the texture recognition region 101 may include nine recognizing units 110, each of the first contrast sub-region 1021 and the second contrast sub-region 1022 includes three contrast units 120, the nine recognizing units 110 are arranged in a 3×3 array, and each of those included in the first contrast sub-region 1021 and the second contrast sub-region 1022 includes three contrast units 120 arranged in a row.

It should be noted that, the ultrasonic sensor 100 provided by at least one embodiment of the present disclosure is not limited to having one texture recognition region 101 and two contrast sub-regions; the number of recognizing units 110 included in the texture recognition region 101 is not limited to nine; the number of contrast units 120 included in the contrast sub-region is not limited to three; the contrast units 120 included in the contrast sub-region are not limited to being arranged in a row; the number of texture recognition regions 101 and the contrast sub-regions included in the ultrasonic sensor 100, the number of recognizing units 110 included in the contrast sub-region, the number of contrast units 120 included in the contrast sub-region, and an arrangement mode of the contrast units 120 may be set according to actual application requirements. Exemplary description will be given below in conjunction with FIG. 4B to FIG. 4D.

Figure 4B:
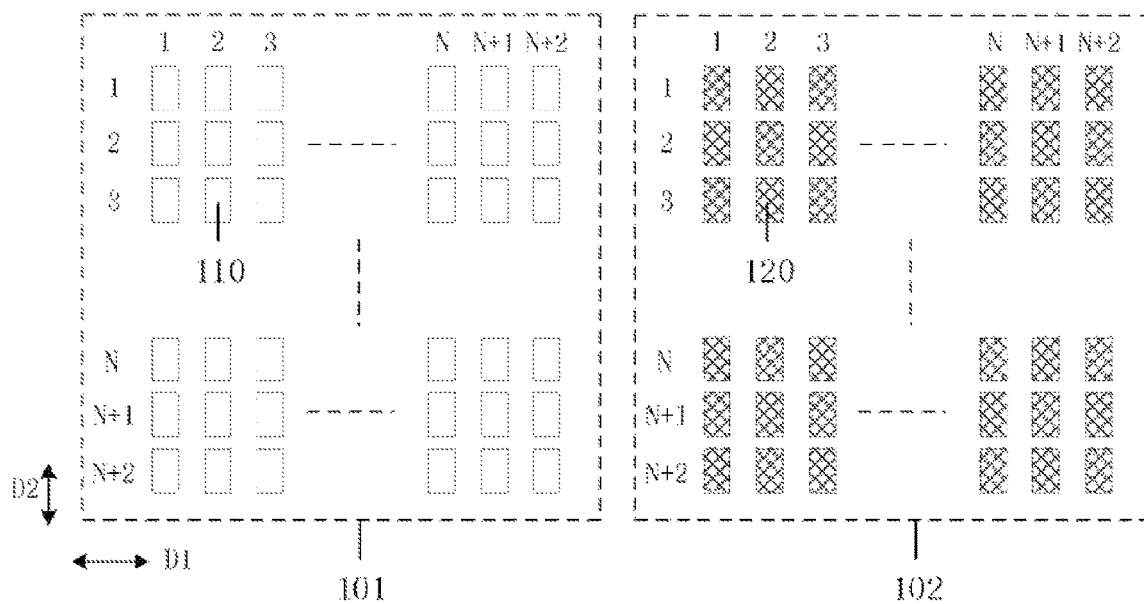
FIG. 4B is a schematic plan view of another ultrasonic sensor provided by at least one embodiment of the present disclosure.

FIG. 4B is a schematic plan view of another ultrasonic sensor 100 provided by at least one embodiment of the present disclosure. In an example, as shown in FIG. 4B, the ultrasonic sensor 100 includes one texture recognition region 101; the contrast region 102 includes one contrast sub-region; the number of recognizing units 110 included in the texture recognition region 101 is equal to (N+2)×(N+2); and the number of contrast units 120 included in the contrast sub-region is equal to (N+2)×(N+2); here, N is a positive integer.

Figure 4C:
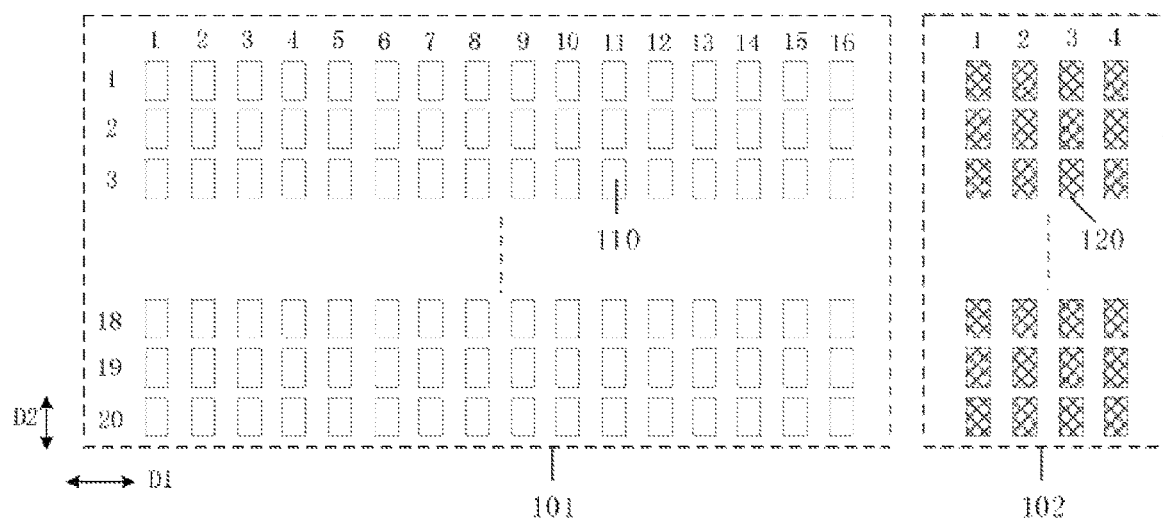
FIG. 4C is a schematic plan view of yet another ultrasonic sensor provided by at least one embodiment of the present disclosure.

FIG. 4C is a schematic plan view of yet another ultrasonic sensor 100 provided by at least one embodiment of the present disclosure. In another example, as shown in FIG. 4C, the ultrasonic sensor 100 includes one texture recognition region 101; the contrast region 102 includes one contrast sub-region; the number of recognizing units 110 included in the texture recognition region 101 is equal to 16×20=320; and the number of contrast units 120 included in the contrast region is equal to 4×20=80.

Figure 4D:
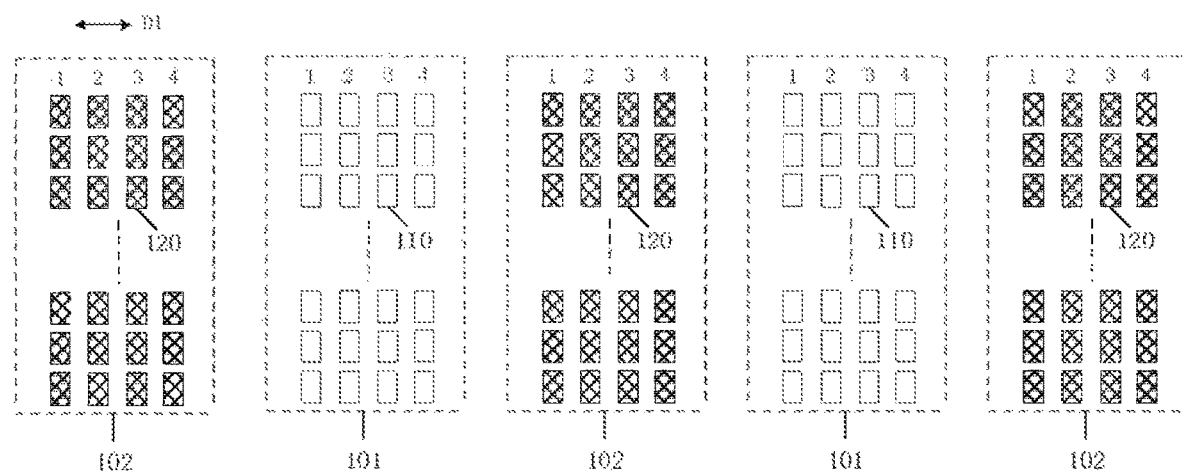
FIG. 4D is a schematic plan view of still another ultrasonic sensor provided by at least one embodiment of the present disclosure.

FIG. 4D is a schematic plan view of still another ultrasonic sensor 100 provided by at least one embodiment of the present disclosure. In an example, as shown in FIG. 4D, the ultrasonic sensor 100 includes a plurality of (e.g., two) texture recognition regions 101 and a plurality of (e.g., three) contrast sub-regions. For example, a plurality of texture recognition regions 101 and a plurality of contrast sub-regions are alternately arranged in the first direction D1; and each recognizing unit 110 in each texture recognition region 101 may take an electrical signal output by a contrast unit 120 closest to the recognizing unit 110 or an average value of electrical signals output by a plurality of contrast units 120 as the at least portion of a noise value of the recognizing unit 110, so that the deducted noise value may be closer to the noise value of the at least one recognizing unit 110, and quality of an image (e.g., a fingerprint image) acquired based on the above-described electrical signal from which at least a portion of the noise has been deducted may be further improved.

It should be noted that, as shown in FIG. 4D, the number of the plurality of texture recognition regions 101, the number of the plurality of contrast sub-regions, the number of columns of recognizing units 110 included in each texture recognition region 101, the number of columns of contrast units 120 included in each contrast region 102 are only examples, which may be set by those skilled in the art according to actual application requirements.

For example, the texture recognition region 101 and the contrast region 102 may have same or similar electrical structures. For example, the first sub-electrode 112 and the third sub-electrode 122 have the same shape and size; the second sub-electrode 113 and the fourth sub-electrode 123 have the same shape and size. In this case, electrical structures of the texture recognition region 101 and the contrast region 102 are closer to each other, thereby making a noise value of at least one recognizing unit 110 closer to a noise value of a corresponding contrast unit 120 in the at least one contrast unit 120, which may further improve quality of an image (e.g., a fingerprint image) acquired based on the above-described electrical signal from which at least a portion of the noise has been deducted.

For example, the first dielectric material layer 111 and the second dielectric material layer 121 are both made of polyvinylidene fluoride films and have different polarization degrees. For example, both the first dielectric material layer 111 and the second dielectric material layer 121 are made of a same material (e.g., a same substrate), so that the noise value of the at least one recognizing unit 110 may be made closer to the noise value of the at least one contrast unit 120. For example, when the piezoelectric strain constant of the first dielectric material layer 111 is greater than the piezoelectric strain constant of the second dielectric material layer 121, the polarization degree of the first dielectric material layer 111 is greater than the polarization degree of the second dielectric material layer 121 (e.g., remnant polarization intensity). For example, the remnant polarization intensity of a dielectric material refers to a polarization intensity of a dielectric material when the dielectric material is not placed in an electric field and is not subjected to pressure. For example, the greater the polarization degree (e.g., the remnant polarization intensity) of the dielectric material, the more responsive the dielectric material is to pressure applied thereon, that is, in a case where the force applied to the dielectric material remains constant, the greater the polarization degree (e.g., the remnant polarization intensity) of the dielectric material, the greater the quantity of charges generated by the dielectric material, and correspondingly, the greater the intensity of the available signal output by the dielectric material.

It should be noted that, although at least one embodiment of the present disclosure is exemplarily described by taking that both the first dielectric material layer 111 and the second dielectric material layer 121 are made of polyvinylidene fluoride films, the embodiments of the present disclosure are not limited thereto. For example, the first dielectric material layer 111 and the second dielectric material layer 121 may also be made of Aluminum Nitride (AlN), Zinc Oxide (ZnO), lead zirconate titanate Piezoelectric (PZT) ceramics or other suitable piezoelectric material.

For example, as shown in FIG. 3B, the ultrasonic sensor 100 further includes a backplane 130; an orthogonal projection of the second dielectric material layer 121 on the backplane 130 and an orthogonal projection of the first dielectric material layer 111 on the backplane 130 are spaced apart from each other. For example, by making the orthogonal projection of the second dielectric material layer 121 on the backplane 130 and the orthogonal projection of the first dielectric material layer 111 on the backplane 130 spaced from each other, when the first dielectric material layer 111 is being polarized with an electric field (e.g., a high-voltage electric field), influence of the electric field on the second dielectric material layer 121 may be reduced, so as to reduce the polarization degree of the second dielectric material layer 121 and reduce the value of the piezoelectric strain constant D33 of the second dielectric material layer 121 after polarization (e.g., to prevent the second dielectric material layer 121 from being polarized); in this case, the intensity of the available signal in the electrical signal output by the contrast unit 120 may be reduced, and the intensity of the available signal in the electrical signal from which at least a portion of the noise has been deducted in increased, which may further improve quality of an image (e.g., a fingerprint image) acquired based on the above-described electrical signal from which at least a portion of the noise has been deducted.

The solution for forming the first dielectric material layer 111 and the second dielectric material layer 121 by actively polarizing only a region of a same dielectric material layer that corresponds to the texture recognition region will be exemplified below in conjunction with two examples; however, the embodiments of the present disclosure are not limited thereto.

In a first example, an unpolarized dielectric material layer (e.g., an unpolarized PVDF film) may be formed firstly, and then a first portion 146 of the dielectric material layer may be polarized with a polarizing device, and a second portion 147 of the dielectric material layer is shielded while polarizing the first portion 146 of the dielectric material layer with a polarizing device, so that the polarization degree of the second portion 147 is less than the polarization degree of the first portion 146. Exemplary description will be given below in conjunction with FIG. 5 to FIG. 11.

Figure 5:
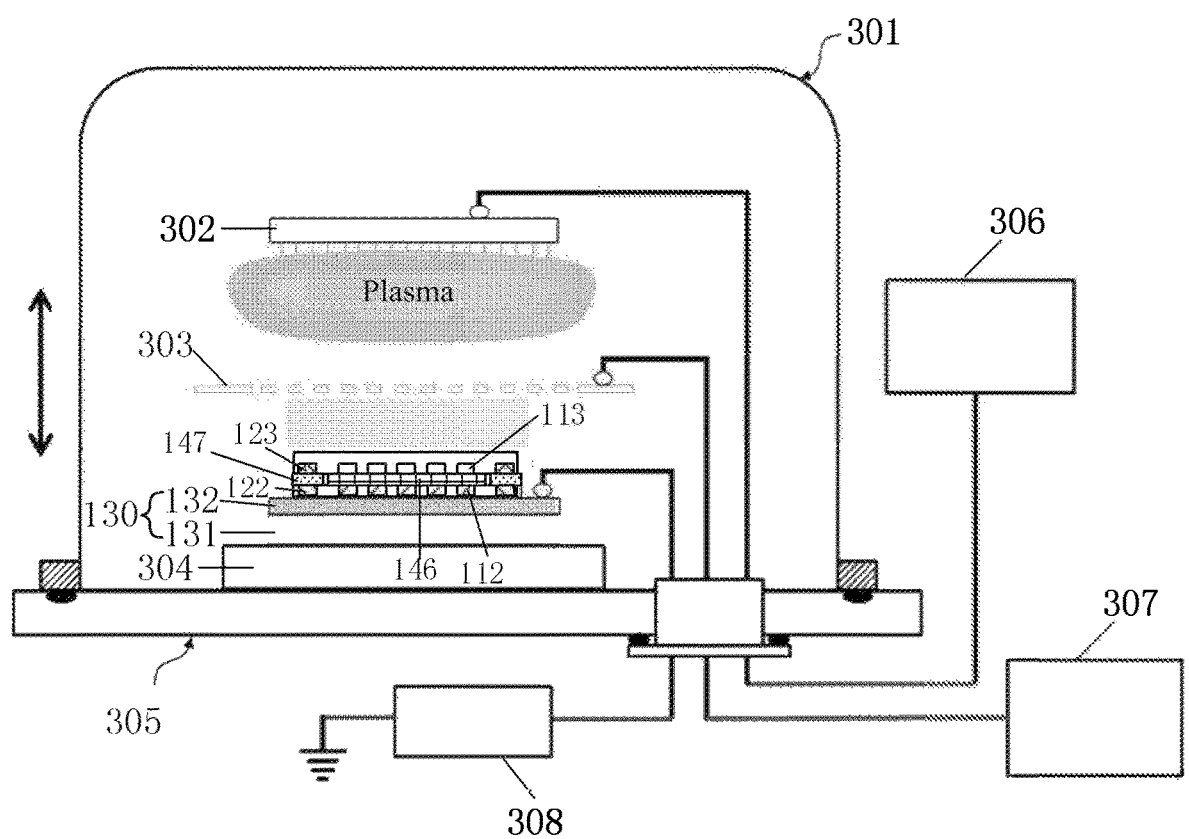
FIG. 5 shows a schematic diagram of a first example of polarizing a portion of region of a polyvinylidene fluoride film according to at least one embodiment of the present disclosure.

FIG. 5 shows a schematic diagram of a first example of polarizing a portion of region of a polyvinylidene fluoride film provided by at least one embodiment of the present disclosure. For example, as shown in FIG. 5, the polarizing a portion of region of the polyvinylidene fluoride film may include steps below.

Step S201: placing a laminate of the backplane 130, the first electrode layer, the dielectric material layer (e.g., the unpolarized PVDF film) and the second electrode layer in a polarizing device.

For example, the first electrode layer includes a first sub-electrode 112 of at least one fingerprint recognizing unit 110 and a third sub-electrode 122 of at least one contrast unit 120; the second electrode layer includes a second sub-electrode 113 of at least one fingerprint recognizing unit 110 and a fourth sub-electrode 123 of at least one contrast unit 120; the dielectric material layer includes the first portion 146 for the first dielectric material layer 111 and the second portion 147 for the second dielectric material layer 121 that are made of a same material (e.g., PVDF); the backplane 130 includes a base substrate 131 and a circuit structure 132; and the circuit structure 132 of the backplane 130 is respectively electrically connected with the first sub-electrode 112, the second sub-electrode 113, the third sub-electrode 122 and the fourth sub-electrode 123 via corresponding wirings.

Step S202: forming a high-voltage electric field between a discharge electrode 302 and a grid electrode 303 of the polarizing device, so as to polarize the first portion 146 and convert the first portion 146 into the first dielectric material layer 111; and before or while the polarizing device is configured to form plasma, applying a shield voltage to the fourth sub-electrode 123 to convert the second portion 147 into the second dielectric material layer 121.

For example, by applying a shield voltage to the fourth sub-electrode 123, a potential difference between an upper surface and a lower surface of the second portion 147 may be made zero or very small (e.g., not enough to polarize the second portion 147), such that the high-voltage electric field formed between the discharge electrode 302 and the grid electrode 303 of the polarizing device cannot polarize the second portion 147, or the high-voltage electric field makes the polarization degree of the second portion 147 less than the polarization degree of the first portion 146, which makes the piezoelectric strain constant of the first dielectric material layer 111 greater than the piezoelectric strain constant of the second dielectric material layer 121. For example, the ratio of the piezoelectric strain constant of the first dielectric material layer 111 to the piezoelectric strain constant of the second dielectric material layer 121 is greater than or equal to 2 (e.g., greater than or equal to 2.5).

For example, by applying a shield voltage (e.g., a ground voltage, e.g., 0 V) on the fourth sub-electrode 123, an electronic shield layer may be formed in a position where the second portion 147 of the PVDF film that is located in the contrast region 102 is in contact with an ionized air layer, so that there is no potential difference between an upper surface and a lower surface of the second portion 147 of the PVDF film that is located in the contrast region 102, in this case, no polarization electric field is formed between the upper surface and the lower surface of the second portion 147, the second portion 147 of the PVDF film that is located in the contrast region 102 is not polarized. In some examples, although there is no potential difference between the upper surface and the lower surface of the second portion 147 of the PVDF film that is located in the contrast region 102, since the second portion 147 is located in the ionizing field, electrons on both sides (e.g., the left side and the right side) of the second portion 147 may also partially polarize the second portion 147, in this case, the piezoelectric strain constant D33 of the second portion 147 of the PVDF film that is located in the contrast region 102 is not equal to zero. However, as described above, since the ratio of the piezoelectric strain constant of the first dielectric material layer 111 to the piezoelectric strain constant of the second dielectric material layer 121 is relatively great, the available signal in the electrical signal output by the contrast unit 120 is relatively less (e.g., negligible).

For example, in the process of polarizing the first portion 146, the first sub-electrode 112, the third sub-electrode 122 and the fourth sub-electrode 123 may be electrically connected with a ground terminal of the polarizing device; and the second sub-electrode 113 located in the texture recognition region 101 is made suspended.

Figure 6:
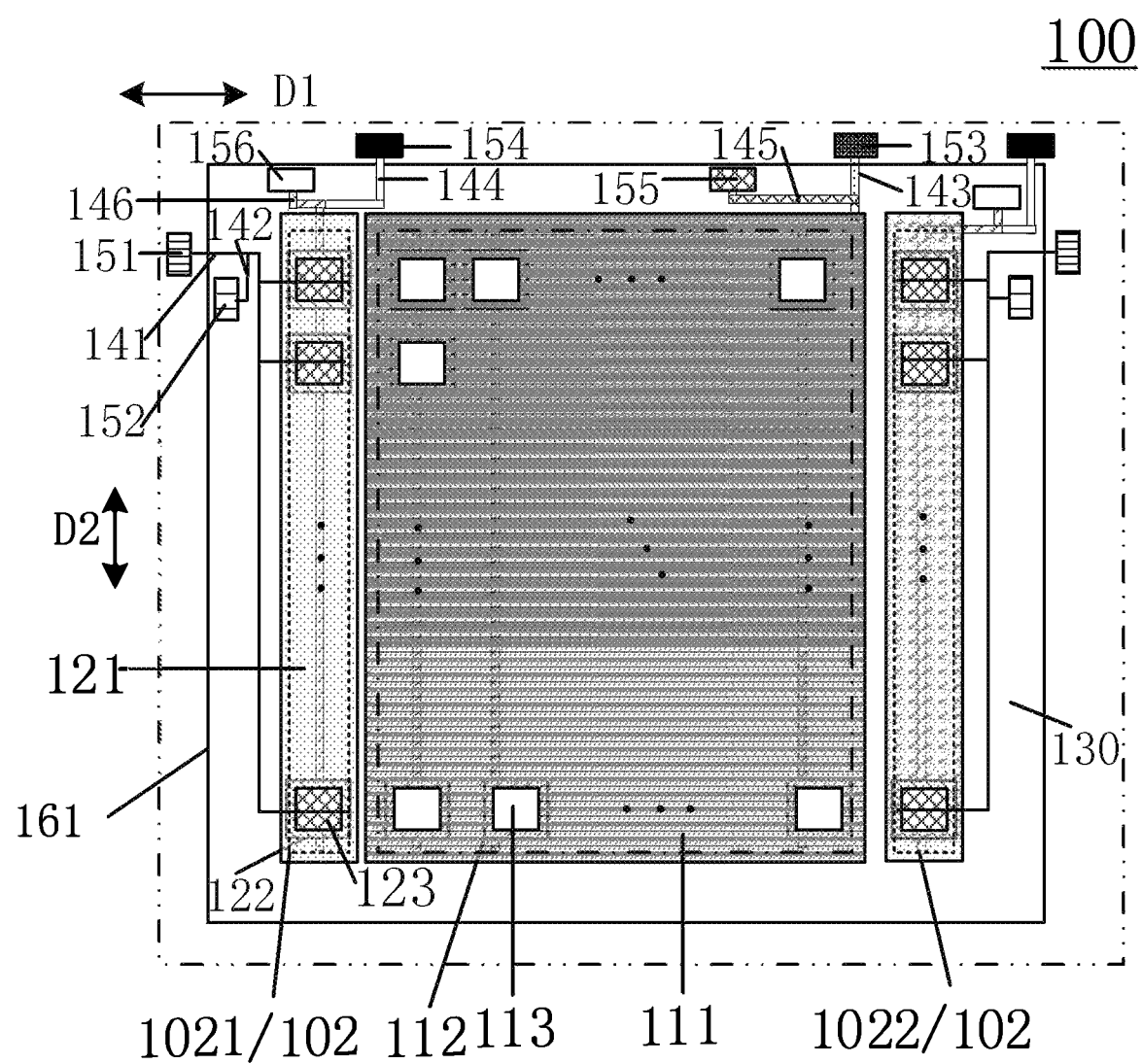
FIG. 6 shows a schematic plan view of a laminate of a backplane, a first electrode layer, a dielectric material layer and a second electrode layer according to at least one embodiment of the present disclosure.
Figure 7:
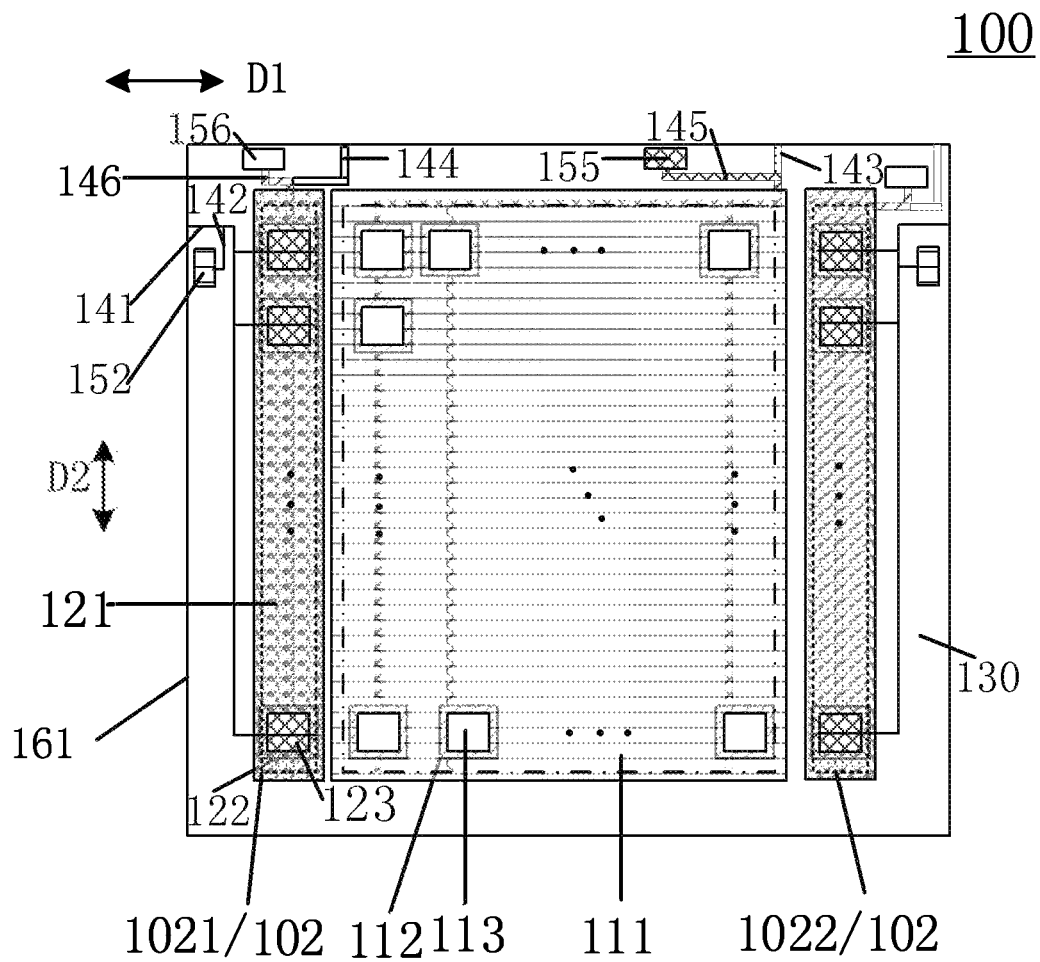
FIG. 7 shows a schematic plan view of the ultrasonic sensor after cutting the backplane along a cutting line shown in FIG. 6.

FIG. 6 shows a schematic plan view of a laminate of a backplane 130, a first electrode layer, a dielectric material layer and a second electrode layer provided by at least one embodiment of the present disclosure; and FIG. 7 shows another schematic plan view a laminate of a backplane 130, a first electrode layer, a dielectric material layer and a second electrode layer provided by at least one embodiment of the present disclosure. It should be noted that, for convenience of description, FIG. 6 also shows a first pad 151, a third pad 153 and a fourth pad 154 for applying a voltage to the first sub-electrode 112, the third sub-electrode 122 and the fourth sub-electrode 123 in the polarizing process.

For example, as shown in FIG. 6, the ultrasonic sensor 100 further includes a first wiring 141, and the first wiring 141 may be electrically connected with the fourth sub-electrode 123, so that when polarizing the first portion 146, a shield voltage (e.g., a ground voltage) may be applied via the first wiring 141 to the fourth sub-electrode 123. For example, that "a wiring may be electrically connected with an electrode" refers to that the wiring and the electrode are electrically connected with each other during at least one stage (e.g., at least a period) during operation of the ultrasonic sensor.

For example, as shown in FIG. 6, the ultrasonic sensor 100 further includes a third wiring 143 and a fourth wiring 144; the third wiring 143 may be electrically connected with the first sub-electrode 112, and the fourth wiring 144 may be electrically connected with the third sub-electrode 112, so, when polarizing the first portion 146, a voltage (e.g., a ground voltage) may be applied to the first sub-electrode 112 via the third wiring 143, and a voltage (e.g., a ground voltage) may be applied to the third sub-electrode 122 via the fourth wiring 144.

For example, before polarizing the first portion 146, the first wiring 141, the third wiring 143 and the fourth wiring 144 are respectively electrically connected with the first pad 151, the third pad 153 and the fourth pad 154, so, when polarizing the first portion 146, a shield voltage (e.g., a ground voltage) may be applied to the fourth sub-electrode 123 via the first pad 151 and the first wiring 141, a voltage (e.g., a ground voltage) is applied to first sub-electrode 112 via the third pad 153 and the third wiring 143, and a voltage (e.g., a ground voltage) is applied to the third sub-electrode 122 via the fourth pad 154 and the fourth wiring 144.

For example, as shown in FIG. 6, after polarization of the first portion 146 is completed, and the first portion 146 and the second portion 147 are respectively transformed into the first dielectric material layer 111 and the second dielectric material layer 121, the backplane 130 may be cut along a cutting line 161 shown in FIG. 6, so, the first pad 151, the third pad 153 and the fourth pad 154 may be removed, that is, the first pad 151, the third pad 153 and the fourth pad 154 do not present in the final product of the ultrasonic sensor 100. A schematic plan view of the ultrasonic sensor 100 after cutting the backplane 130 along the cutting line 161 shown in FIG. 6 is shown in FIG. 7.

For example, the cutting the backplane 130 may refer to cutting a base substrate 131 (e.g., a glass substrate) included in the backplane 130. For example, by cutting away the first pad 151, the third pad 153 and the fourth pad 154, adverse effects during operation of the ultrasonic sensor 100 caused by at least one of the first pad 151, the third pad 153 and the fourth pad 154 may be avoided.

For example, as shown in FIG. 7, the first wiring 141 may extend from a position electrically connected with the fourth sub-electrode 123 to an edge of the backplane 130; the third wiring 143 extends from a position electrically connected with the first sub-electrode 112 to the edge of the backplane 130; and the fourth wiring 144 extends from a position electrically connected with the third sub-electrode 122 to the edge of the backplane 130.

For example, as shown in FIG. 6 and FIG. 7, the ultrasonic sensor 100 further includes a second wiring 142, a fifth wiring 145 and a sixth wiring 146; the second wiring 142 may be electrically connected with the fourth sub-electrode 123, and an orthogonal projection of an end portion of the second wiring 142 on the backplane 130 are spaced apart from the edge of the backplane 130; the fifth wiring 145 may be electrically connected with the first sub-electrode 112; an orthogonal projection of an end portion of the fifth wiring 145 on the backplane 130 is spaced apart from the edge of the backplane 130; the sixth wiring 146 may be electrically connected with the third sub-electrode 122; and an orthogonal projection of an end portion of the sixth wiring 146 on the backplane 130 is spaced apart from the edge of the backplane 130. For example, as shown in FIG. 6 and FIG. 7, the second wiring 142 is electrically connected (e.g., directly connected) with the first wiring 141; the third wiring 143 is electrically connected (e.g., directly connected) with the fifth wiring 145; and the fourth wiring 144 is electrically connected (e.g., directly connected) with the sixth wiring 146.

In some examples, the ultrasonic sensor 100 after cutting the backplane 130 along the cutting line 161 shown in FIG. 6 further includes a second pad 152, a fifth pad 155 and a sixth pad 156; the end portion of the second wiring 142, the end portion of the fifth wiring 145 and the end portion of the sixth wiring 146 are respectively electrically connected with the second pad 152, the fifth pad 155 and the sixth pad 156, so that during operation, corresponding driving circuits may supply electrical signals respectively to the fourth sub-electrode 123, the first sub-electrode 112 and the third sub-electrode 122 via the second pad 152, the fifth pad 155 and the sixth pad 156.

For clarity, specific implementation modes of the second wiring 142, the fifth wiring 145 and the sixth wiring 146 will be described after a specific structure of the backplane 130 is described, and no details will be repeated here.

Figure 8:
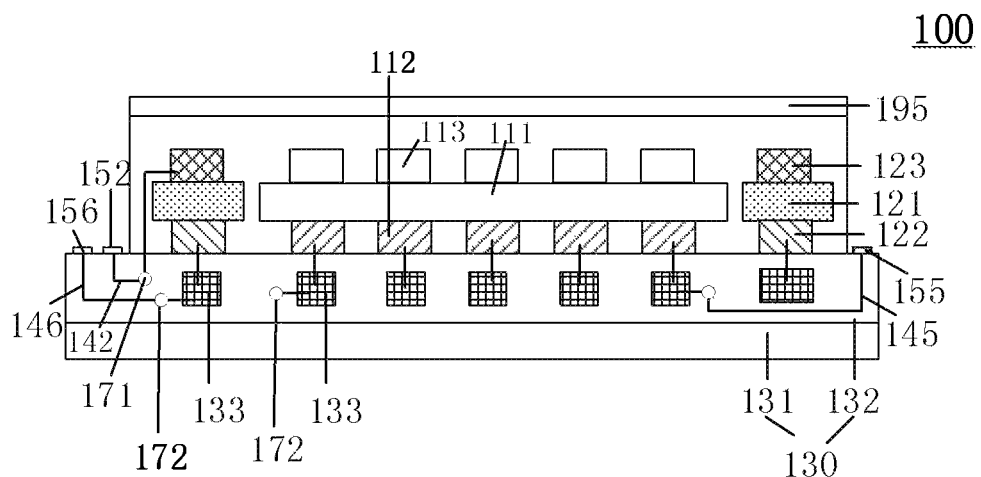
FIG. 8 is another cross-sectional schematic diagram of an ultrasonic sensor provided by at least one embodiment of the present disclosure.

FIG. 8 is another cross-sectional schematic diagram of an ultrasonic sensor 100 provided by at least one embodiment of the present disclosure. As compared with the cross-sectional schematic diagram of the ultrasonic sensor 100 shown in FIG. 3B, the cross-sectional schematic diagram of the ultrasonic sensor 100 shown in FIG. 8 shows an exemplary structure of the backplane 130.

For example, as shown in FIG. 8, the backplane 130 includes a base substrate 131 and a circuit structure 132 stacked in the third direction. For example, as shown in FIG. 8, the circuit structure 132 includes a plurality of pixel unit circuits. For example, a first part of the plurality of pixel unit circuits are configured to be electrically connected with at least one recognizing unit 110 to apply a voltage to the at least one recognizing unit 110 and cause the recognizing unit 110 to emit ultrasonic waves, and to acquire an electrical signal (e.g., a current signal) from the at least one recognizing unit 110. For example, a second part of the plurality of pixel unit circuits are configured to be electrically connected with at least one contrast unit 120 to apply a voltage to the at least one contrast unit 120, and to acquire an electrical signal (e.g., a current signal) from the at least one contrast unit 120.

In some examples, a structure of the pixel unit circuits electrically connected with the recognizing unit 110 and a structure of the pixel unit circuits electrically connected with the contrast unit 120 are shown in FIG. 8.

Figure 9:
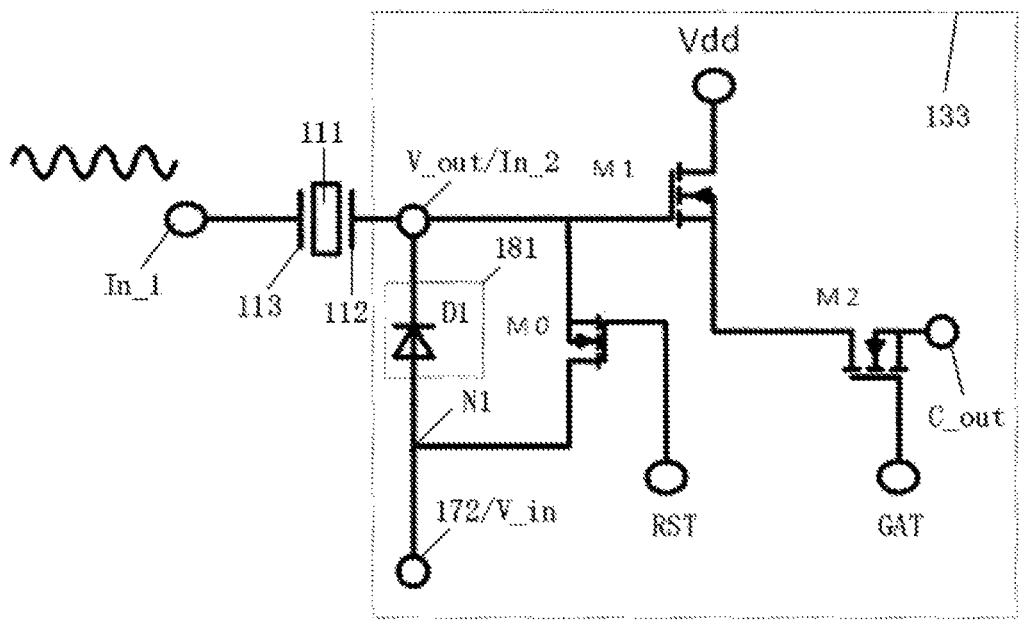
FIG. 9 is an exemplary circuit diagram of a pixel unit circuit shown in FIG. 8 that is electrically connected with a recognizing unit.

FIG. 9 is an exemplary circuit diagram of the pixel unit circuit 133 shown in FIG. 8 that is electrically connected with the recognizing unit 110. For convenience of description, FIG. 9 also shows the first sub-electrode 112, the second sub-electrode 113 and the first dielectric material layer 111 included in the recognizing unit 110, as well as a first terminal In_1 and a second terminal In_2 of the recognizing unit 110.

For example, as shown in FIG. 9, the pixel unit circuit 133 includes a first voltage input terminal V_in (corresponding to reference sign 172 in FIG. 8), a voltage output terminal V_out, a driving transistor M1 and a first one-way ON circuit 181; the driving transistor M1 is configured to be electrically connected with a first power terminal Vdd to convert a voltage signal on the first sub-electrode 112 into a current signal; the first one-way ON circuit 181 includes a first terminal and a second terminal, a conduction direction of the first one-way ON circuit 181 being from the first terminal of the first one-way ON circuit 181 to the second terminal of the first one-way ON circuit 181; a control terminal of the driving transistor M1 and the second terminal of the first one-way ON circuit 181 are both electrically connected with the voltage output terminal V_out; and the first terminal of the first one-way ON circuit 181 and the first voltage input terminal V_in are both electrically connected with a first node N1.

For example, as shown in FIG. 9, the first one-way ON circuit 181 includes a first diode D1, a positive electrode of the first diode D1 is configured as the first terminal of the first one-way ON circuit 181, and a negative electrode of first diode D1 is configured as the second terminal of the first one-way ON circuit 181.

For example, as shown in FIG. 9, the pixel unit circuit 133 further includes a first transistor M0 and a second transistor M2; a control terminal RST of the first transistor M0 is configured to receive a reset control signal, a first terminal of the first transistor M0 is configured to be electrically connected with the first node N1, a second terminal of the first transistor M0 is configured to be electrically connected with a control terminal of a driving transistor M1; a first terminal of the driving transistor M1 is configured to be electrically connected with the first power terminal Vdd, a second terminal of the driving transistor M1 is configured to be electrically connected with a first terminal of the second transistor M2; a control terminal GAT of the second transistor M2 is configured to receive a read control signal, and a second terminal of the second transistor M2 is configured as a signal output terminal C_out of the pixel unit circuit, to output an electrical signal generated by the first dielectric material layer by converting ultrasonic waves.

It should be noted that, the first terminal In_1 and the second terminal In_2 of the recognizing unit 110 as well as the voltage output terminal V_out and the signal output terminal C_out of the pixel unit circuit 133, the control terminal RST of the first transistor M0 and the control terminal GAT of the second transistor M2 shown in FIG. 9 are only for convenience of description, and there is no need to provide, for example, solder joints or pads as the first terminal In_1, the second terminal In_2, etc. in an actual product. For example, the first sub-electrode of the recognizing unit 110 is used as the second terminal In_2 to be electrically connected with the voltage output terminal V_out of the pixel unit circuit 133.

Figure 10:
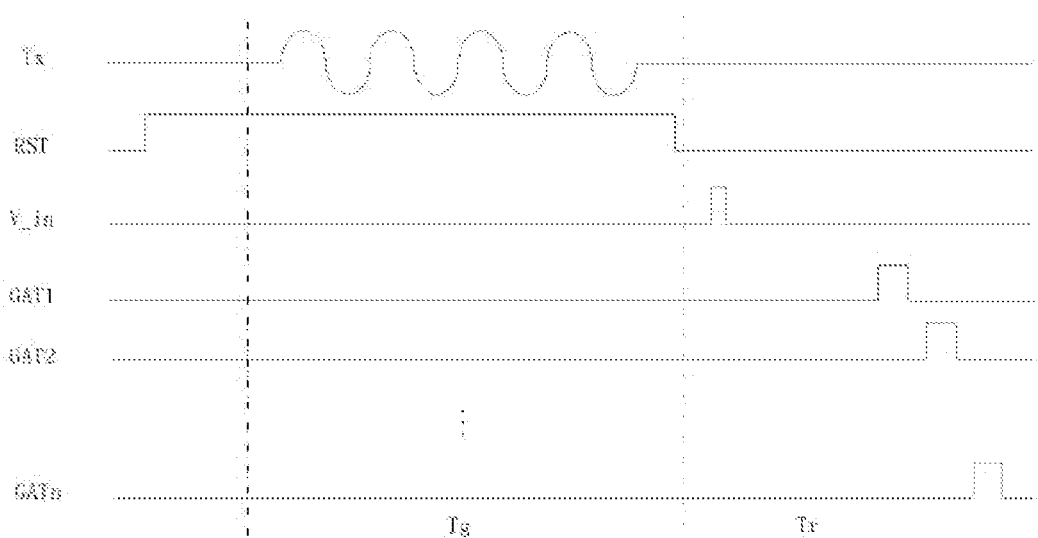
FIG. 10 shows a driving sequence diagram of the pixel unit circuit shown in FIG. 9 that is electrically connected with the recognizing unit when the ultrasonic sensor is operating.

FIG. 10 shows a driving sequence diagram of the pixel unit circuit 133 electrically connected with the recognizing unit 110 shown in FIG. 9 when the ultrasonic sensor 100 is operating. For example, as shown in FIG. 9 and FIG. 10, an operation cycle of the ultrasonic sensor 100 includes an ultrasonic wave generation stage Tg and an ultrasonic wave reception stage Tr.

For example, as shown in FIG. 9 and FIG. 10, in the ultrasonic generation stage Tg, the reset control signal received by the control terminal of the first transistor M0 is a valid signal (i.e., a signal or a level that turns on the transistor), thus the first transistor M0 is turned on, and the first voltage (e.g., the ground voltage) supplied by the first voltage input terminal V_in of the pixel unit circuit is transmitted to the control terminal of the driving transistor M1, the voltage output terminal V_out of the pixel unit circuit 133, and the first sub-electrode 112 of the recognizing unit 110 electrically connected with the voltage output terminal V_out of the pixel unit circuit 133 via the turned-on first transistor M0. For example, the first terminal In_1 and the second sub-electrode 113 of the recognizing unit 110 are configured to receive an AC voltage, so the recognizing unit 110 is configured to mechanically vibrate and generate ultrasonic waves in the ultrasonic wave generation stage Tg. For example, since the control terminal of the driving transistor M1 is turned off under an action of the first voltage (e.g., the ground voltage), the pixel unit circuit does not read the electrical signal on the first sub-electrode 112 during the ultrasonic generation stage Tg. For example, in the ultrasonic generation stage Tg, read control signals received by control terminals GAT of second transistors M2 of pixel unit circuits in different rows are all invalid signals (i.e., signals or levels that turn off the transistors; for example, low levels), and thus, second transistors M2 of pixel unit circuits located in different rows are all turned off.

For example, as shown in FIG. 9 and FIG. 10, in the ultrasonic reception stage Tr, the reset control signal received by the control terminal of the first transistor M0 is an invalid signal, so the first transistor M0 is turned off; a second voltage (e.g., a bias voltage) supplied by the first voltage input terminal V_in of the pixel unit circuit is transmitted to the control terminal of the driving transistor M1 via the first diode D1, so that the driving transistor M1 is kept turned on during the ultrasonic wave reception stage Tr; control terminals GAT of the second transistors M2 of pixel unit circuits located in different rows receive valid signals (e.g., high levels) in sequence, so second transistors M2 of pixel unit circuits located in different rows are turned on in sequence, and the pixel unit circuits located in different rows output electrical signals in sequence.

Figure 11:
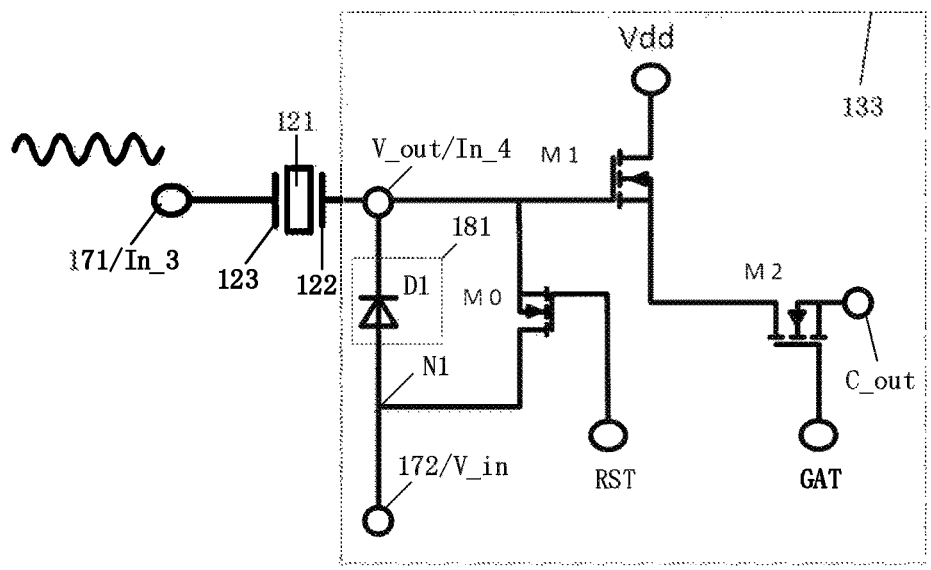
FIG. 11 is an exemplary circuit diagram of the pixel unit circuit shown in FIG. 8 that is electrically connected with a contrast unit.

FIG. 11 is an exemplary circuit diagram of the pixel unit circuit 133 shown in FIG. 8 that is electrically connected with the contrast unit 120. For convenience of description, FIG. 11 also shows the third sub-electrode 122 and the fourth sub-electrode 123 included in the recognizing unit 110, the second dielectric material layer 121 as well as the first terminal In_3 and the second terminal In_4 of the contrast unit 120 (corresponding to reference sign 171 in FIG. 8).

It should be noted that, the first terminal In_3, the second terminal In_4 of the contrast unit 120, etc. shown in FIG. 11 are only for convenience of description, and there is no need to provide, for example, solder joints or pads in an actual product as the first terminal In_3, the second terminal In_4 of the contrast unit 120, etc.

For example, the driving sequence diagram of the pixel unit circuit 133 electrically connected with the contrast unit 120 shown in FIG. 11 when the ultrasonic sensor 100 is operating may be the same as that shown in FIG. 10, and no details will be repeated here.

For example, as shown in FIG. 8 and FIG. 11, the first terminal 171 (In_3) of the contrast unit 120 is electrically connected with the fourth sub-electrode 123, and may be electrically connected with the second pad 152 via the second wiring 142, so, the AC voltage applied through the second pad 152 when the ultrasonic sensor 100 is operating may be transmitted to the fourth sub-electrode 123 of the contrast unit 120 through the second wiring 142 and the first terminal 171 (In_3) of the contrast unit 120. For example, the first voltage input terminal V_in (172) of the pixel unit circuit 133 that is electrically connected with the contrast unit 120 may be electrically connected with the sixth pad 156 via the sixth wiring 146, so when the ultrasonic sensor 100 is operating, a first voltage (e.g., a ground voltage) and a second voltage (e.g., a bias voltage) applied by the sixth pad 156 may be transmitted to the third sub-electrode 122 of the contrast unit 120 via the sixth wiring 146, the first voltage input terminal V_in (172), and the one-way ON circuit 181.

For example, as shown in FIG. 8 and FIG. 9, the first voltage input terminal V_in (172) of the pixel unit circuit 133 electrically connected with the recognizing unit 110 may be electrically connected with the fifth pad 155 via the fifth wiring 145, so, when the ultrasonic sensor 100 is operating, the first voltage (e.g., the ground voltage) and the second voltage (e.g., the bias voltage) applied via the fifth pad 155 may be transmitted to the first sub-electrode 112 of the recognizing unit 110 via the fifth wiring 145, the first voltage input terminal V_in (172) and the one-way ON circuit 181.

For example, as shown in FIG. 6 and FIG. 7, the first wiring 141 is electrically connected (e.g., directly connected) with the second wiring 142, so the first wiring 141 is electrically connected with the fourth sub-electrode 123 of the contrast unit 120; the fourth wiring 144 is electrically connected (e.g., directly connected) with the sixth wiring 146, so the fourth wiring 144 is electrically connected with the third sub-electrode 122 of the contrast unit 120; the third wiring 143 is electrically connected with (e.g., directly connected) the fifth wiring, so the third wiring 143 is electrically connected with the first sub-electrode 112 of the recognizing unit 110. In this case, when polarizing the first portion 146 with the polarizing device, a shield voltage (e.g., a ground voltage) may be applied to the fourth sub-electrode 123 of the contrast unit 120 via at least a part of the first pad 151, the first wiring 141, and the second wiring 142, as well as the first terminal 171 of the contrast unit 120; a voltage (e.g., a ground voltage) is applied to the third sub-electrode 122 of the contrast unit 120 via at least a part of the fourth pad 154, the fourth wiring 14, and the sixth wiring 146, as well as the first voltage input terminal V_in (172) of the pixel unit circuit 133 electrically connected with contrast unit 120; and a voltage (e.g., a ground voltage) is applied to the first sub-electrode 112 of the recognizing unit 110 via at least a part of the third pad 153, the third wiring 143 and the fifth wiring as well as the first voltage input terminal V_in (172) of the pixel unit circuit 133 electrically connected with the recognizing unit 110; so, when polarizing the first portion 146, the fourth sub-electrode 123 of the contrast unit 120 may be multiplexed as an electronic shielding layer, so that there is no need to provide an additional electronic shielding layer on the dielectric material layer, and there is no need to remove the electronic shielding layer after the polarization is completed, so that the fabrication process of the ultrasonic sensor 100 may be simplified. For example, since a patterning process of the electrode layer is relatively mature, dimensional precision and positional precision of the fourth sub-electrode 123 are relatively high, and as compared with a case where the electronic shielding layer is provided separately from the dielectric material layer, a difficulty in aligning may be reduced and a polarizing process may be simplified.

In the second example, an unpolarized polyvinylidene fluoride film may be formed firstly, and then a voltage is directly input to the first sub-electrode 112 and the second sub-electrode 113 via the backplane 130, so that the two opposite surfaces of the first portion 146 has a high-voltage electric field in the third direction, so as to polarize the first portion 146, and transform the first portion 146 into the first dielectric material layer 111, and further transform the second portion 147 into the second dielectric material layer 121. For example, in the polarizing process, the third sub-electrode 122 and the fourth sub-electrode 123 may both be suspended. Since a high-voltage electric field is not formed between the two opposite surfaces of the second portion 147 in the third direction, the polarization degree of the second portion 147 may be made less than the polarization degree of the first portion 146. Exemplary description will be given below in conjunction with FIG. 12 to FIG. 16.

Figure 12:
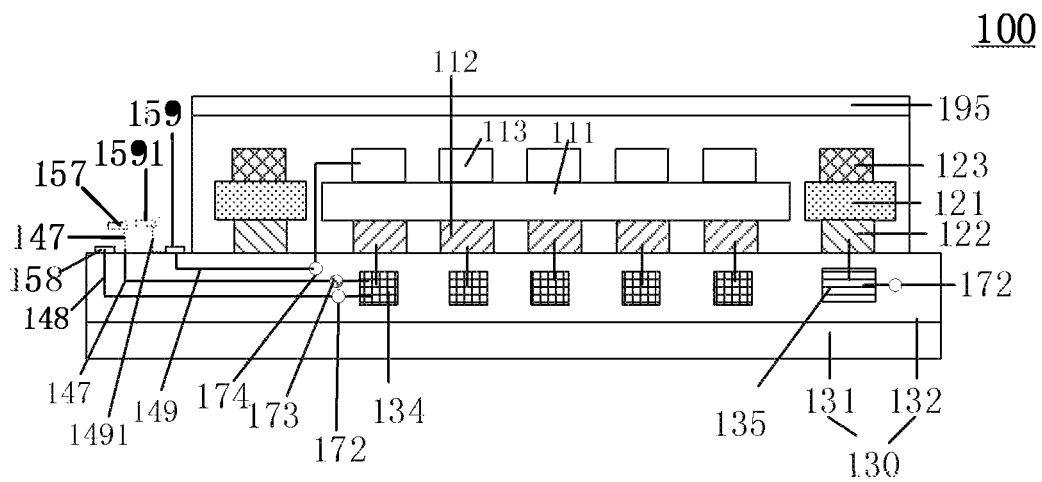
FIG. 12 is a cross-sectional schematic diagram of another ultrasonic sensor provided by at least one embodiment of the present disclosure.

FIG. 12 is a cross-sectional schematic diagram of another ultrasonic sensor 100 provided by at least one embodiment of the present disclosure. The ultrasonic sensor 100 shown in FIG. 12 is similar to the ultrasonic sensor 100 shown in FIG. 8. Therefore, only differences between the two will be described here, and similarities will not be repeated.

The differences between the ultrasonic sensor 100 shown in FIG. 12 and the ultrasonic sensor 100 shown in FIG. 8 include points below. (1) The wirings electrically connected with the second sub-electrode 113 of the ultrasonic sensor 100 shown in FIG. 12 is different from the wirings electrically connected with the second sub-electrode 113 of the ultrasonic sensor 100 shown in FIG. 8. (2) The wirings electrically connected with the fourth sub-electrode 123 of the ultrasonic sensor 100 shown in FIG. 12 is different from the wirings electrically connected with the fourth sub-electrode 123 of the ultrasonic sensor 100 shown in FIG. 8. (3) The pixel unit circuit (hereinafter referred to as the first pixel unit circuit 134) of the ultrasonic sensor 100 shown in FIG. 12 that is electrically connected with the first sub-electrode 112 is different from the pixel unit circuit of the ultrasonic sensor 100 shown in FIG. 8 that is electrically connected with the first sub-electrode 112; the pixel unit circuit (hereinafter referred to as the second pixel unit circuit 135) of the ultrasonic sensor 100 shown in FIG. 12 that is electrically connected with the third sub-electrode 122 is different from the pixel unit circuit of the ultrasonic sensor 100 shown in FIG. 8 that is electrically connected with the third sub-electrode 122, and accordingly, the wirings electrically connected with the first pixel unit circuit 134 are changed correspondingly.

With respect to the above-described first point of difference, the wirings electrically connected with the second sub-electrode 113 of the ultrasonic sensor 100 shown in FIG. 12 include a ninth wiring 149 and a tenth wiring 1491; for example, as shown in FIG. 12, the first terminal 171 of the recognizing unit 110 may be electrically connected with the ninth pad 159 via the ninth wiring 149, so when the ultrasonic sensor 100 is operating, an AC voltage applied via the ninth pad 159 may be transmitted to the second sub-electrode 113 of the recognizing unit 110. For example, as shown in FIG. 12, the tenth wiring 1491 is electrically connected (e.g., directly connected) with the ninth wiring 149, so the first terminal 171 of the recognizing unit 110 may be connected with the tenth pad 1591 via the ninth wiring 149 and the tenth wiring 1491; in this case, when polarizing the first portion 146, a voltage (e.g., a negative high voltage, e.g., negative 3 kV) may be applied to the second sub-electrode 113 of the recognizing unit 110 via the tenth pad 1591, the tenth wiring 1491 and the ninth wiring 149 as well as the first terminal In_1 (174) of the recognizing unit 110. For example, the wirings electrically connected with the second sub-electrode 113 of the ultrasonic sensor 100 shown in FIG. 8 includes only one wiring (e.g., includes the ninth wiring 149 but does not include the tenth wiring 1491).

With respect to the above-described second point of difference, the wiring electrically connected with the fourth sub-electrode 123 of the ultrasonic sensor 100 shown in FIG. 12 only includes the second wiring 142 shown in FIG. 7 and FIG. 8, but does not include the first wiring 141.

Figure 13:
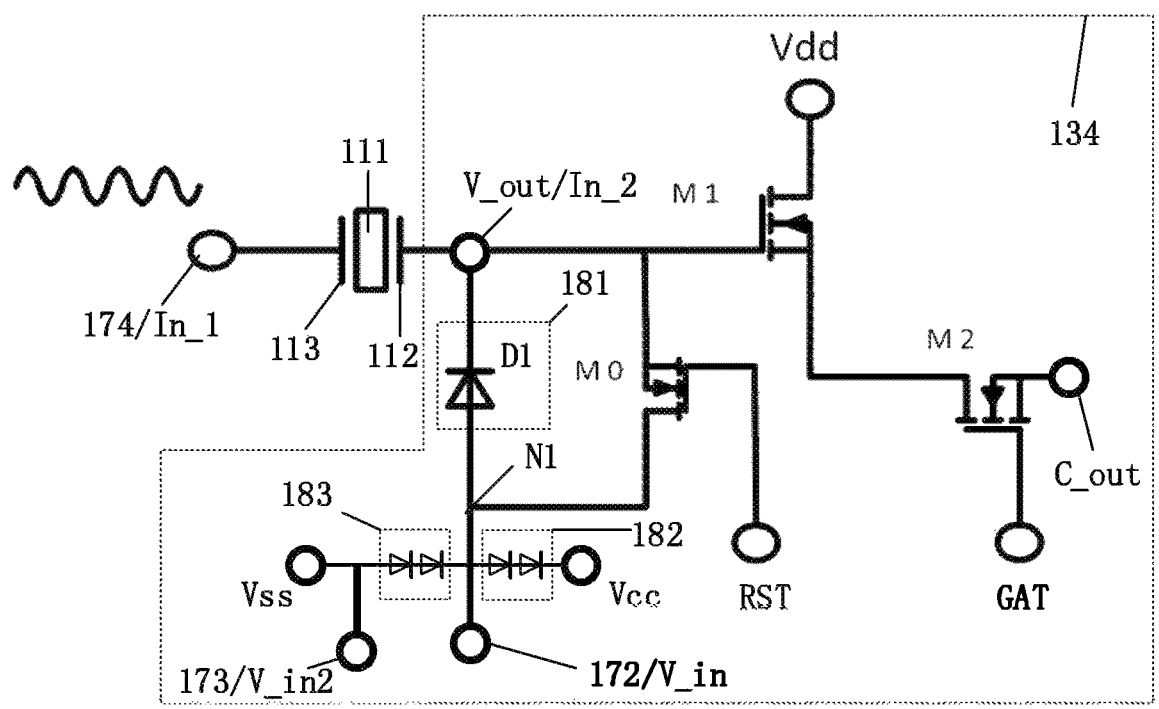
FIG. 13 shows a pixel unit circuit of the ultrasonic sensor shown in FIG. 12 that is electrically connected with the first sub-electrode.
Figure 14:
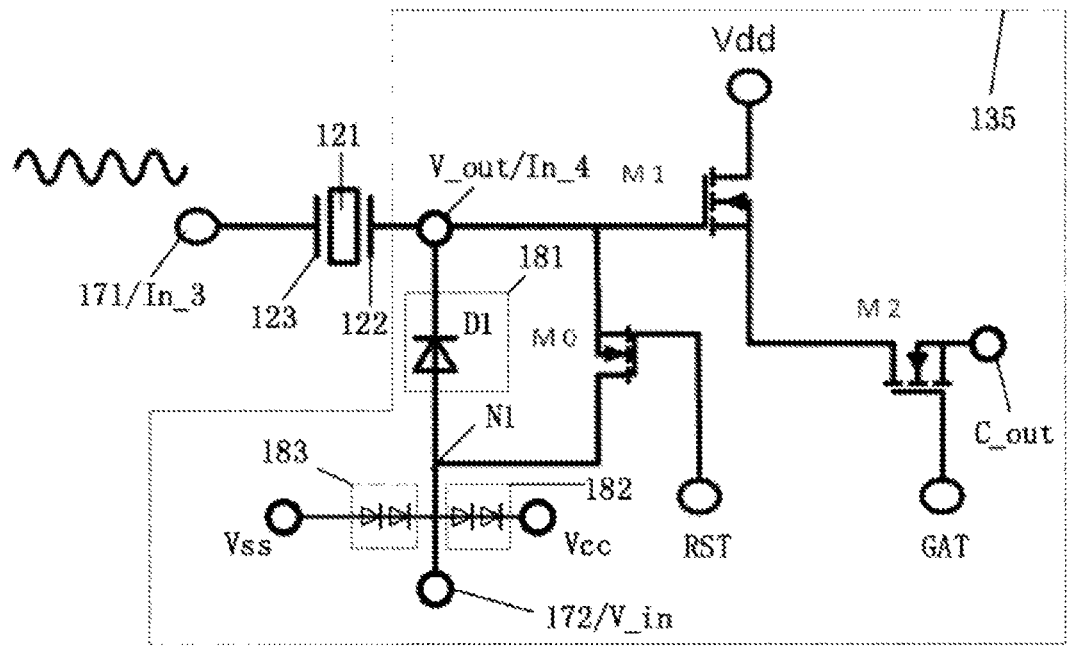
FIG. 14 shows an exemplary circuit diagram of a pixel unit circuit of the ultrasonic sensor shown in FIG. 12 that is electrically connected with a third sub-electrode.

With respect to the above-described third point of difference, FIG. 13 shows a pixel unit circuit (hereinafter referred to as the first pixel unit circuit 134) of the ultrasonic sensor 100 shown in FIG. 12 that is electrically connected with the first sub-electrode 112; and FIG. 14 shows an exemplary circuit diagram of a pixel unit circuit (hereinafter referred to as the second pixel unit circuit 135) of the ultrasonic sensor 100 shown in FIG. 12 that is electrically connected with the third sub-electrode 122.

For example, as compared with the pixel unit circuit electrically connected with the first sub-electrode 112 shown in FIG. 9, as shown in FIG. 12 and FIG. 13, the first pixel unit circuit 134 further includes a second voltage input terminal V_in2; as shown in FIG. 13, the second voltage input terminal V_in2 of the first pixel unit circuit 134 may be electrically connected with the first node N1. For example, as shown in FIG. 12, the seventh wiring 147 is electrically connected with the second voltage input terminal V_in2 (corresponding to reference sign 173 in FIG. 12) of the first pixel unit circuit 134; and the eighth wiring 148 is electrically connected with the first voltage input terminal V_in of the first pixel unit circuit 134 (corresponding to reference sign 172 in FIG. 12).

For example, as shown in FIG. 12, the seventh wiring 147 is electrically connected with the seventh pad 157; and the eighth wiring 148 is electrically connected with the eighth pad 158.

For example, when polarizing the first portion 146, a voltage (e.g., a ground voltage) may be applied to the first sub-electrode 112 of the recognizing unit 110 via the seventh pad 157, the seventh wiring 147 and the second voltage input terminal V_in2 (corresponding to reference sign 173 in FIG. 12) of the first pixel unit circuit 134. For example, after polarizing the first portion 146, the seventh pad 157 and the tenth pad 1591 may be cut away to avoid adverse effects of at least one of the seventh pad 157 and the tenth pad 1591 on the ultrasonic sensor 100 in an operation process.

For example, after the seventh pad 157 and the tenth pad 1591 are cut away, the seventh wiring extends from the position electrically connected with the first sub-electrode to the edge of the backplane; an orthogonal projection of an end portion of the eighth wiring on the backplane is spaced apart from the edge of the backplane; the tenth wiring extends to the edge of the backplane; and an orthogonal projection of an end portion of the ninth wiring 149 on the backplane is spaced from the edge of the backplane.

For example, the end portion of the eighth wiring 148 and the end portion of the ninth wiring 149 are respectively electrically connected with the eighth pad 158 and the ninth pad 159, so a corresponding driving circuit may supply an electrical signal respectively to the first sub-electrode 112 and the second sub-electrode 113 via the eighth pad 158 and the ninth pad 159 during operation.

For example, the pixel unit circuit electrically connected with the first sub-electrode 112 further includes a second one-way ON circuit 182 and a third one-way ON circuit 183. The second one-way ON circuit 182 includes a third terminal and a fourth terminal, a conduction direction of the second one-way ON circuit 182 is from the third terminal of the second one-way ON circuit 182 to the fourth terminal of the second one-way ON circuit 182; the third one-way ON circuit 183 includes a fifth terminal and a sixth terminal, a conduction direction of the third one-way ON circuit 183 is from the fifth terminal of the third one-way ON circuit 183 to the sixth terminal of the third one-way ON circuit 183; the third terminal of the second one-way ON circuit 182 is connected with the first node N1, and the fourth terminal of the second one-way ON circuit 182 is connected with the second power terminal Vcc to receive a voltage Vmax supplied by the second power terminal; the fifth terminal of the third one-way ON circuit 183 is connected with the third power terminal Vss to receive a voltage Vmin supplied by the second power terminal, the sixth terminal of the third one-way ON circuit 183 is connected with the first node N1; and the second voltage input terminal V_in2 of the first pixel unit circuit 134 is connected with the fifth terminal of the third one-way ON circuit 183. For example, by providing the second one-way ON circuit 182 and the third one-way ON circuit 183, the recognizing unit 110 may be protected from overvoltage; for example, the voltage output by the recognizing unit 110 may be clamped between Vmin and Vmax. For example, Vmin=−20 V, Vmax=20 V, in this case, the second one-way ON circuit 182 and the third one-way ON circuit 183 may clamp the voltage output by the recognizing unit 110 between ±20 V.

For example, as shown in FIG. 13, at least one (e.g., each) of the second one-way ON circuit 182 and the third one-way ON circuit 183 may include a diode. For example, as shown in FIG. 13, at least one (e.g., each) of the second one-way ON circuit 182 and the third one-way ON circuit 183 may include two diodes connected in series, but the embodiments of the present disclosure are not limited thereto, and at least one of the second one-way ON circuit 182 and the third one-way ON circuit 183 may include other suitable numbers of diodes or other suitable one-way ON circuits.

For example, as shown in FIG. 14, the second pixel unit circuit 135 shown in FIG. 14 is similar to the first pixel unit circuit 134 shown in FIG. 13, except that the second pixel unit circuit 135 does not include the second voltage input terminal V_in2 shown in FIG. 13 and corresponding wirings, so for other structures of the second pixel unit circuit 135 shown in FIG. 14, no details will be repeated here.

It should be noted that, the pixel unit circuit electrically connected with the first sub-electrode 112 and the pixel unit circuit electrically connected with the second sub-electrode 113 that are included in the ultrasonic sensor 100 shown in FIG. 8 may also adopt the circuit shown in FIG. 14; the second pixel unit circuit 135 may also adopt the circuit shown in FIG. 11, and no details will be repeated here.

In some examples, the ultrasonic sensor 100 may further include a suitable number of amplifiers AP and a suitable number of analog-to-digital converters AD. Exemplary description will be given below in conjunction with FIG. 15 to FIG. 17.

Figure 15:
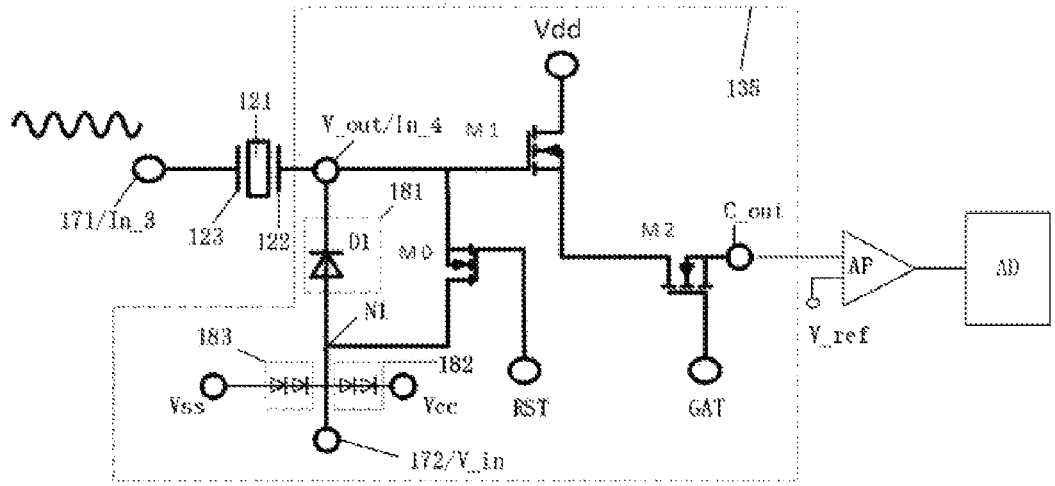
FIG. 15 shows an amplifier and an analog-to-digital converter provided by at least one embodiment of the present disclosure.

FIG. 15 shows an amplifier AP and an analog-to-digital converter AD provided by at least one embodiment of the present disclosure. For example, as shown in FIG. 15, the pixel unit circuit (e.g., the second pixel unit circuit 135) is electrically connected with a signal input terminal of the amplifier AP to supply the electrical signal output by the pixel unit circuit to the signal input terminal of the amplifier AP; a reference signal terminal of the amplifier AP receives, for example, a reference voltage V_ref; an output terminal of the amplifier AP is connected with the analog-to-digital converter AD, so as to supply the amplified electrical signal to the analog-to-digital converter AD (e.g., a chip of the analog-to-digital converter AD), so that the analog-to-digital converter AD may collect data of the electrical signal output by the contrast unit 120.

For example, in a case where the first pixel unit circuit 134 is also electrically connected with the amplifier AP and the analog-to-digital converter AD, the analog-to-digital converter AD corresponding to the first pixel unit circuit 134 may also collect the data of the electrical signal output by the recognizing unit 110.

Figure 16:
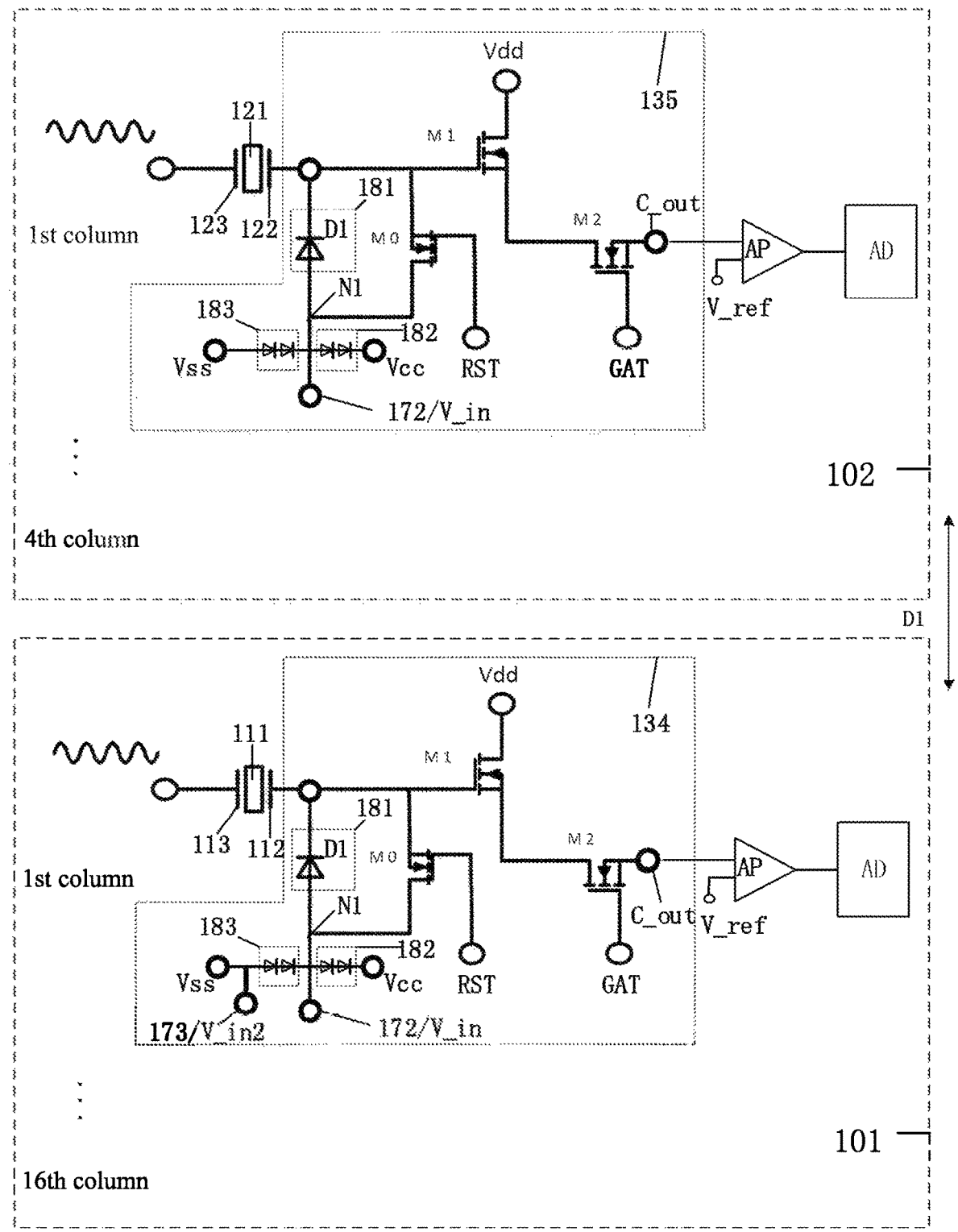
FIG. 16 shows a schematic diagram of an ultrasonic sensor provided by at least one embodiment of the present disclosure.

FIG. 16 shows a schematic diagram of an ultrasonic sensor 100 provided by at least one embodiment of the present disclosure. For example, as shown in FIG. 16, the ultrasonic sensor 100 includes a texture recognition region 101 and a contrast region 102 (including a contrast sub-region) arranged in parallel in the first direction D1; the texture recognition region 101 includes 16 columns of recognizing units 110 and first pixel unit circuits 134 respectively corresponding to the recognizing units 110; the texture recognition region 101 includes 4 columns of contrast units 120 and second pixel unit circuits 135 respectively corresponding to the contrast units 120; in this case, in a process of fabricating the ultrasonic sensor 100 shown in FIG. 16, a high voltage may be directly applied to at least one of the first sub-electrode 112 and the second sub-electrode 113 to polarize the first portion 146. The relevant embodiments may be referred to for the specific method, and no details will be repeated here. For example, the foregoing examples may be referred to for specific description of the first pixel unit circuit 134 and the second pixel unit circuit 135, and no details will be repeated here.

Figure 17:
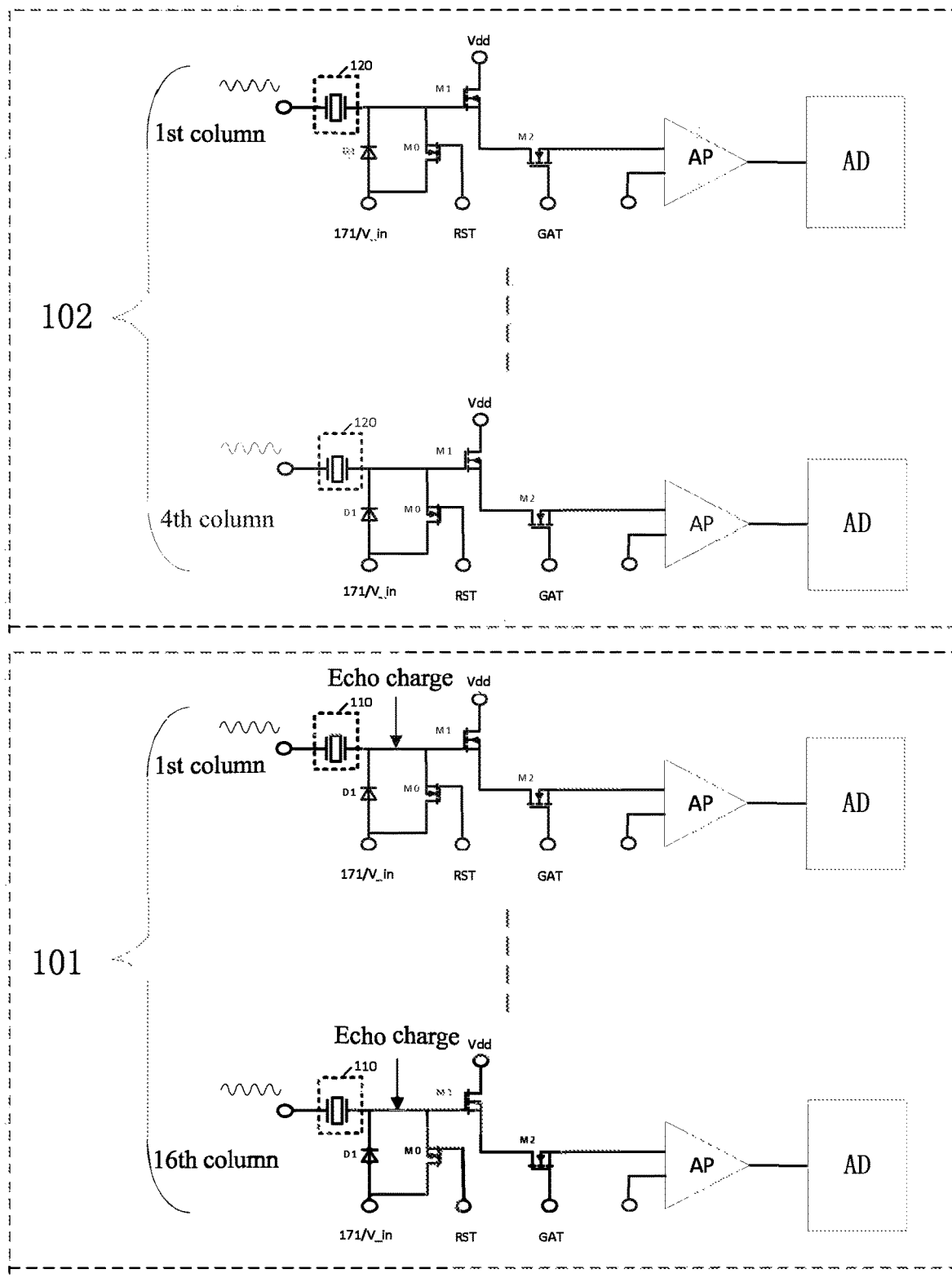
FIG. 17 shows a schematic diagram of an ultrasonic sensor provided by at least one embodiment of the present disclosure.

FIG. 17 shows a schematic diagram of an ultrasonic sensor 100 provided by at least one embodiment of the present disclosure; the ultrasonic sensor 100 shown in FIG. 17 is similar to the ultrasonic sensor 100 shown in FIG. 16, except that the ultrasonic sensor 100 shown in FIG. 17 adopts the pixel unit circuits shown in FIG. 9 and FIG. 11; correspondingly, in a process of fabricating the ultrasonic sensor 100 described in FIG. 17, the contrast region 102 may be formed by using the method of shielding the second portion 147, the relevant embodiments may be referred to for the specific method, and no details will be repeated here.

For example, with respect to the examples of FIG. 16 and FIG. 17, four columns of data in each row in the contrast region 102 may be averaged, and a total of 20 averages may be obtained by sorting in rows. In each column of a reflected echo reception region, the above-described 20 averages are deducted according to row correspondence, to obtain a frame of data as raw data for a next step of data processing.

For example, the RMS value is calculated by taking a root mean square after 50 frames of data minus the average value, and each frame of data contains a total of 320 pieces of data in 20 rows×16 columns. The RMS calculation formula is shown below.

$$RMS = \frac{\sqrt{(x_1 - \bar{x})^2 + (x_2 - \bar{x})^2 + \ldots + (x_n - \bar{x})^2}}{n}$$

Here, $x_n$ represents an nth frame of data, $x_n$ is the data of the reflected echo reception region (i.e., the texture recognition region) minus the average value of the contrast region 102; $\bar{x}$ represents the average value of the n frames of data. For example, the signal-to-noise ratio is equal to the amount of echo signal divided by RMS. The improved noise RMS has a noise reduction effect shown in Table 1 below. It can be seen from Table 1 that, after improvement, the noise reduction effect of the test system is obvious, the RMS noise reduction effect reaches 35%, and the signal-to-noise ratio increases by 35%.

TABLE 1

| Noise reduction effect of noise RMS | | | |
|---|---|---|---|
| Original RMS value | Improved RMS | Noise reduction effect | SNR improvement effect |
| 3 | 25 | 35% | 35% |

It should be noted that, FIG. 8 and FIG. 12 schematically shows correspondence between the first sub-electrode, the second sub-electrode, the third sub-electrode, the fourth sub-electrode and corresponding pads by using wirings, but specific connection modes between the first sub-electrode, the second sub-electrode, the third sub-electrode, the fourth sub-electrode and the corresponding pads are not limited to the examples shown in FIG. 8 and FIG. 12; electrical connections between the first sub-electrode, the second sub-electrode, the third sub-electrode, the fourth sub-electrode and the corresponding pads may be implemented by any combination of via holes and wirings, and no details will be repeated here.

At least one embodiment of the present disclosure also provides a preparation method of an ultrasonic sensor 100; the ultrasonic sensor 100 includes a texture recognition region 101 and a contrast region 102; the contrast region 102 is located on at least one side of the texture recognition region 101; the texture recognition region 101 includes at least one recognizing unit 110; the contrast region 102 includes at least one contrast unit 120; at least one fingerprint recognizing unit 110 includes a first dielectric material layer 111; and at least one contrast unit 120 includes a second dielectric material layer 121. The method includes: forming the first portion 146 for the first dielectric material layer 111 and the second portion 147 for the second dielectric material layer 121 with a same material; and polarizing at least the first portion 146 such that the first portion 146 is transformed into the first dielectric material layer 111 which exhibiting piezoelectric properties, and the second portion 147 is formed into a second dielectric material layer. A piezoelectric strain constant of the first dielectric material layer 111 is greater than a piezoelectric strain constant of the second dielectric material layer 121.

FIG. 18 is an exemplary flow chart of a preparation method of an ultrasonic sensor 100 provided by at least one embodiment of the present disclosure. For example, as shown in FIG. 18, the preparation method of the ultrasonic sensor 100 includes step S110 and step S120 below.

Step S110: forming the first portion 146 for the first dielectric material layer 111 and the second portion 147 for the second dielectric material layer 121 with a same material.

Step S120: polarizing at least the first portion 146 such that the first portion 146 is transformed into the first dielectric material layer 111 which exhibiting piezoelectric properties, and the second portion 147 is formed into the second dielectric material layer.

For example, the piezoelectric strain constant of the first dielectric material layer 111 is greater than the piezoelectric strain constant of the second dielectric material layer 121. For example, by making the piezoelectric strain constant of the first dielectric material layer 111 greater than the piezoelectric strain constant of the second dielectric material layer 121, the electrical signal output by the contrast unit 120 may be taken as at least portion of the noise in the electrical signal output by the recognizing unit 110 and deducted, to acquire an electrical signal from which at least a portion of the noise has been deducted. For example, the above-described electrical signal from which at least a portion of the noise has been deducted may be used as raw data or pre-processed data for subsequent processing (e.g., for converting the electrical signal into a fingerprint image). For example, since the noise in the electrical signal from which at least a portion of the noise has been deducted is reduced, quality of an image (e.g., a fingerprint image) acquired based on the above-described electrical signal from which at least a portion of the noise has been deducted may be improved.

In one example, the second dielectric material layer 121 may not exhibit piezoelectric properties (e.g., a piezoelectric effect); in this case, after the electrical signal output by the contrast unit 120 is taken as at least portion of noise in the electrical signal output by the recognizing unit 110 and deducted, the intensity of the acquired available signal (e.g., an available signal that may be used to characterize distribution of valleys and ridges) in the electrical signal from which at least a portion of the noise has been deducted is not reduced, so that quality of an image (e.g., a fingerprint image) acquired based on the above-described electrical signal from which at least a portion of the noise has been deducted may be improved.

For example, by forming the first portion 146 for the first dielectric material layer 111 and the second portion 147 for the second dielectric material layer 121 with the same material, the noise in the electrical signal output by the recognizing unit 110 including the first dielectric material layer 111 may be made closer to the noise in the electrical signal output by the contrast unit 120 including the second dielectric material layer 121, which, thus, may further improve quality of the image (e.g., the fingerprint image) acquired based on the electrical signal from which at least a portion of the noise has been deducted.

In the first example, the polarizing at least the first portion 146 includes: performing a shielding process on the second portion 147 while polarizing the first portion 146 with a polarizing device, such that a polarization degree of the second portion 147 is less than a polarization degree of the first portion 146.

In the second example, the polarizing at least the first portion 146 includes: applying a first voltage to the first sub-electrode 112 and applying a second voltage to the second sub-electrode 113. A voltage difference between the first voltage and the second voltage is greater than 1,000 V (e.g., 3,000 V).

For clarity, the specific method of polarizing at least the first portion 146 will be described after describing other steps that may be included in the preparation method of the ultrasonic sensor 100, and no details will be described here.

For example, the preparation method of the ultrasonic sensor 100 further includes step S130, step S140 and step S150 below.

Step S130: providing a backplane 130.
Step S140: forming a first electrode layer.
Step S150: forming a second electrode layer.

For example, step S110 to step S150 may be executed in an order of step S130, step S140, step S110, step S150 and step S120; correspondingly, the layers where the backplane 130, the first electrode layer, the first dielectric material layer 111 and the second dielectric material layer 121 are located and the second electrode layer are sequentially arranged in a direction perpendicular to the backplane 130.

For example, by executing step S120 after step S150, the first portion 146 may be at least polarized with the second electrode layer, so that steps of the polarizing process may be simplified, and difficulty in the polarizing process is reduced.

For example, in step S130, the providing a backplane 130 includes step S131 and step S132 below.

Step S131: providing a base substrate 131.
Step S132: forming a circuit structure 132 on the base substrate 131.

For example, in step S131, the base substrate 131 may be a glass substrate, a quartz substrate, a semiconductor substrate (e.g., a silicon substrate), a plastic substrate (e.g., a polyethylene terephthalate (PET) substrate, a polyimide substrate) or a substrate made of other suitable material.

For example, in step S132, the forming a circuit structure 132 on the substrate includes: directly forming the circuit structure 132 on the base substrate 131, or forming the circuit structure 132 firstly, and then transferring the circuit structure 132 onto the above-described base substrate 131. For example, the circuit structure 132 included in the backplane 130 may be fabricated by using a CMOS process.

For example, in step S132, the circuit structure 132 includes a plurality of pixel unit circuits. For example, a first part of the plurality of pixel unit circuits are configured to be electrically connected with at least one recognizing unit 110 to apply a voltage to the at least one recognizing unit 110 and cause the recognizing unit 110 to emit ultrasonic waves, and to acquire an electrical signal (e.g., a current signal) from the at least one recognizing unit 110. For example, a second part of the plurality of pixel unit circuits are configured to be electrically connected with at least one contrast unit 120 to apply a voltage to the at least one contrast unit 120 and acquire an electrical signal (e.g., a current signal) from the at least one contrast unit 120. For example, circuit structure 132 includes at least one of wirings, via holes, and pads for electrical connections. For example, the foregoing ultrasonic sensor 100 may be referred to for a specific structure of the pixel unit circuit, and no details will be repeated here.

For example, the first electrode layer includes a first sub-electrode 112 of at least one fingerprint recognizing unit 110 and a third sub-electrode 122 of at least one contrast unit 120. For example, the first sub-electrode 112 and the third sub-electrode 122 may be referred to as receiving sub-electrodes; and the second sub-electrode 113 and the fourth sub-electrode 123 may be referred to as driving sub-electrodes (or emitting sub-electrodes).

For example, in step S140, the forming a first electrode layer includes step S141 and step S142 below.

Step S141: forming a first electrode material layer on a side of the backplane 130 on which the circuit structure 132 has been formed.
Step S142: patterning the first electrode material layer to form the first sub-electrode 112 and the third sub-electrode 122.

For example, by forming the first electrode material layer on the side of the backplane 130 on which the circuit structure 132 has been formed, the first sub-electrode 112 and the third sub-electrode 122 subsequently formed may be more easily electrically connected with the circuit structure 132.

For example, the first electrode material layer may be made of a transparent conductive material or other suitable material. For example, the transparent conductive material is Indium Tin Oxide (ITO) or Indium Zinc Oxide (IZO).

For example, the related art may be referred to for the method of patterning the first electrode material layer, and the foregoing embodiment of the ultrasonic sensor 100 may be referred to for a specific structure of the first electrode material layer, and no details will be repeated here.

For example, in step S110, the forming the first portion 146 for the first dielectric material layer 111 and the second portion 147 for the second dielectric material layer 121 with a same material includes step S111 and step S112 below.

Step S111: forming a dielectric material layer on the first electrode layer with a same material.

Step S112: patterning the dielectric material layer, to form the first portion 146 for the first dielectric material layer 111 and the second portion 147 for the second dielectric material layer 121.

For example, the above-described same material may be polyvinylidene fluoride (PVDF), in which case, at least one of casting, melting, electrospinning and spin coating may be used to form the dielectric material layer on the first electrode layer. For example, a thickness of PVDF may be 9 microns.

It should be noted that, the above-described same material is not limited to polyvinylidene fluoride. For example, the above-described same material may also be a material such as Zinc Oxide (ZnO) which does not exhibit piezoelectric properties before polarization, but exhibits piezoelectric properties after polarization. For example, the dielectric material layer is formed on a side of the first electrode layer that is away from the backplane 130.

For example, the dielectric material layer may be patterned such that an orthogonal projection of the first portion 146 on the backplane is spaced apart from an orthogonal projection of the second portion 147 on the backplane.

In some examples, the dielectric material layer may not be patterned, but a portion of the dielectric material layer that corresponds to the texture recognition region may be directly polarized.

For example, the related art may be referred to for the method of patterning the dielectric material layer; the specific structure of the dielectric material layer corresponds to the structure of the first dielectric material layer 111 and the second dielectric material layer 121 (e.g., shape, size and arrangement); the above-described embodiment of the ultrasonic sensor 100 may be referred to, and no details will be repeated here.

For example, in step S150, the forming a second electrode layer includes step S151 and step S152 below.

Step S151: forming the second electrode material layer on the dielectric material layer.

Step S152: patterning the second electrode material layer to form the second sub-electrode 113 and the fourth sub-electrode 123.

For example, the second sub-electrode 113 and the first portion 146 of the first sub-electrode 112 are stacked for forming the recognizing unit 110, the fourth sub-electrode 123 and the second portion 147 of the second sub-electrode 113 are stacked for forming the contrast unit 120.

For example, the second electrode material layer may be made of a transparent conductive material or other suitable material. For example, the transparent conductive material is Indium Tin Oxide (ITO) or Indium Zinc Oxide (IZO).

For example, at least one of the first electrode material layer and the second electrode material layer may be made of a conjugated microporous polymer electrode material (TAT). For example, the second electrode material layer may be made of a conjugated microporous polymer electrode material (TAT).

For example, the related art may be referred to for the method of patterning the second electrode material layer; and the foregoing embodiment of the ultrasonic sensor 100 may be referred to for the specific structure of the second electrode material layer, and no details will be repeated here.

For example, the preparation method of the ultrasonic sensor 100 further includes at least one of step S160, step S170 and step S180 below.

Step S160: forming a first insulating layer 191 on the backplane 130 on which the first electrode layer has been formed (referring to FIG. 19A).

Step S170: forming a second insulating layer 192 on a side of the second electrode layer that is away from the dielectric material layer (referring to FIG. 19A).

Step S180: forming a metal film 195 on a side of the second insulating layer 192 that is away from the second electrode layer.

For example, step S160 may be executed after step S140 and before step S110. For example, step S170 may be executed after step S150 and before step S120. For example, step S180 may be executed after step S120.

For example, the first insulating layer 191 and the second insulating layer 192 may be made of an inorganic material such as silicon oxide (SiOx), silicon oxynitride (SiNxOy), silicon nitride (SiNx), an organic material, or other suitable material. For example, the first insulating layer 191 may planarize the side of the first electrode layer that is away from the backplane 130, and the second insulating layer 192 may planarize the side of the second electrode layer that is away from the backplane 130, which thus, may facilitate subsequent process. For example, the first insulating layer 191 and the second insulating layer 192 may be made of SU 8 photoresist. For example, a thickness of at least one of the first insulating layer 191 and the second insulating layer 192 is 20 microns. For example, the first insulating layer 191 may also be referred to as primer coating (primer C).

For example, in step S180, the metal film 195 may be a silver film; in this case, the forming a metal film 195 on a side of the second insulating layer 192 that is away from the second electrode layer includes: screen printing a layer of silver paste on the side of the second insulating layer 192 that is away from the second electrode layer; and transforming the silver paste into a silver film. For example, by forming the metal film 195 (e.g., a silver film) on the side of the second insulating layer 192 that is away from the second electrode layer, the frequency of the ultrasonic waves emitted by the recognizing unit 110 may be adjusted. For example, the metal film 195 (e.g., the silver film) may act as an acoustic matching layer and be used to reflect ultrasonic waves. For example, a thickness of the silver film may be 18 microns. For example, the metal film 195 (e.g., the silver film) may be an outermost film layer of the ultrasonic sensor 100.

In the first example, in step S120, at least the first portion 146 is polarized, so that the first portion 146 is transformed into the first dielectric material layer 111 exhibiting piezoelectric properties, and the forming the second portion 147 into the second dielectric material layer includes step S151 to step S153 below.

Step S151: placing a laminate of the first electrode layer, the dielectric material layer and the second electrode layer in a polarizing device.

Step S152: causing the polarizing device to form plasma, so as to polarize the first portion 146.

Step S153: applying a shield voltage on the fourth sub-electrode 123 to shield the plasma.

For example, in step S151, the laminated structure of the backplane 130, the first electrode layer, the dielectric material layer and the second electrode layer may be placed in the polarizing device shown in FIG. 5.

FIG. 19A is an exemplary cross-sectional view of a laminated structure of a backplane 130, a first electrode layer, a dielectric material layer, and a second electrode layer according to at least one embodiment of the present disclosure.

For example, in step S152, the causing the polarizing device to form plasma includes forming a high-voltage electric field between the discharge electrode 302 and the grid electrode 303 of the polarizing device shown in FIG. 5, so that the discharge electrode may ionize the air in a surrounding environment of the discharge electrode and generate plasma.

For example, in step S153, the applying a shield voltage on the fourth sub-electrode 123 includes applying the shield voltage (e.g., the ground voltage) to the fourth sub-electrode 123 via the polarizing device. For example, the fourth sub-electrode 123 may be connected with the ground terminal of the polarizing device via the backplane 130.

For example, as shown in FIG. 19A, an upper surface of the second insulating layer 192 (e.g., SiNx) is in contact with an electron cloud in the polarizing device, so the second sub-electrode 113 (e.g., a Tx terminal) is at a high level, the first sub-electrode 112 is connected with the ground terminal of the polarizing device via the backplane 130, and therefore, a potential difference is generated between an upper end and a lower end of the PVDF to generate polarization.

For example, the applying a shield voltage on the fourth sub-electrode 123 includes: applying the shield voltage on the fourth sub-electrode 123 with the first wiring 141. For example, a terminal for applying the shield voltage (e.g., the ground terminal of the polarizing device) is electrically connected with the first pad 151, so the shield voltage supplied by the terminal for applying the shield voltage may be applied to the fourth sub-electrode 123 electrically connected with the first wiring 141 via the first pad 151 and the first wiring 141. For example, in at least one example of the preparation method of the ultrasonic sensor 100, the shield voltage is 10 V to 30 V (e.g., 15 V, 20 V, or 25 V).

For example, a shield voltage may be applied on the fourth sub-electrode 123 before or while the polarizing device is caused to form plasma, that is, step S153 may be executed before or simultaneously with step S152.

FIG. 19B is an exemplary diagram of a first example of a polarization method provided by at least one embodiment of the present disclosure.

For example, as shown in FIG. 19B, with respect to the first example, when at least the first portion 146 is polarized, a voltage V_in_AA may be applied to the first sub-electrode 112 located in the texture recognition region 101, and a voltage V_in_dm and a shield voltage In_3_dm are respectively applied to the third sub-electrode 112 and the fourth sub-electrode 123 in the contrast region 102, and the second sub-electrode 113 located in the texture recognition region 101 is made suspended.

For example, with respect to the first example, the voltage V_in_AA may be applied to the first sub-electrode 112 via the first voltage input terminal V_in of the pixel unit circuit electrically connected with the first sub-electrode 112; and the voltage V_in_AA is, for example, a ground voltage. For example, the voltage V_in_dm may be applied to the third sub-electrode 122 via the first voltage input terminal V_in of the pixel unit circuit electrically connected with the third sub-electrode 122; and the voltage V_in_dm is, for example, a ground voltage. For example, a voltage shield voltage In_3_dm may be applied to the fourth sub-electrode 123 via the first terminal In_1 of the contrast unit 120; and the electrical shield voltage In_3_dm is, for example, a ground voltage.

In the second example, in step S120, at least the first portion 146 is polarized, so that the first portion 146 is transformed into the first dielectric material layer 111 exhibiting piezoelectric properties, and the causing the second portion 147 to be formed into the second dielectric material layer includes: applying a first voltage to the first sub-electrodes 112, and applying a second voltage to the second sub-electrodes 113.

For example, a voltage difference between the first voltage and the second voltage is greater than 1000 V (e.g., 3000 V). For example, the above-described first voltage may be a ground voltage; and the above-described second voltage may be a negative high voltage. For example, the first voltage and the second voltage may respectively be equal to 0 V and negative 3 kV.

Figure 20:
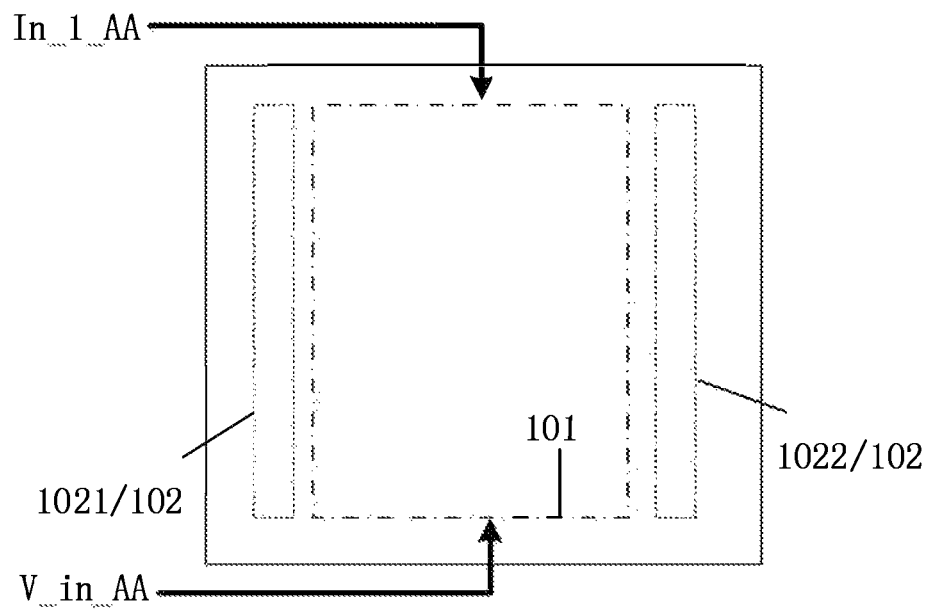
FIG. 20 is an exemplary diagram of a second example of a polarization method provided by at least one embodiment of the present disclosure.

FIG. 20 is an exemplary diagram of a second example of a polarization method provided by at least one embodiment of the present disclosure.

For example, as shown in FIG. 20, with respect to the second example, when polarizing at least the first portion 146 is, the voltage V_in_AA may be applied to the first sub-electrode 112 located in the texture recognition region 101; the voltage In_1_AA may be applied to the second sub-electrodes 113 located in the texture recognition region 101; and the third sub-electrode 122 and the fourth sub-electrode 123 of the contrast region 102 are suspended.

For example, with respect to the second example, the voltage V_in_AA may be applied to the first sub-electrode 112 via the first voltage input terminal V_in of the pixel unit circuit electrically connected with the first sub-electrode 112, and the voltage V_in_AA is, for example, a ground voltage; the voltage In_1_AA is applied to the second sub-electrode 113 via the first terminal In_1 of the recognizing unit 110; and the voltage In_1_AA is, for example, a negative high voltage (e.g., negative 3 kV).

Figure 21:
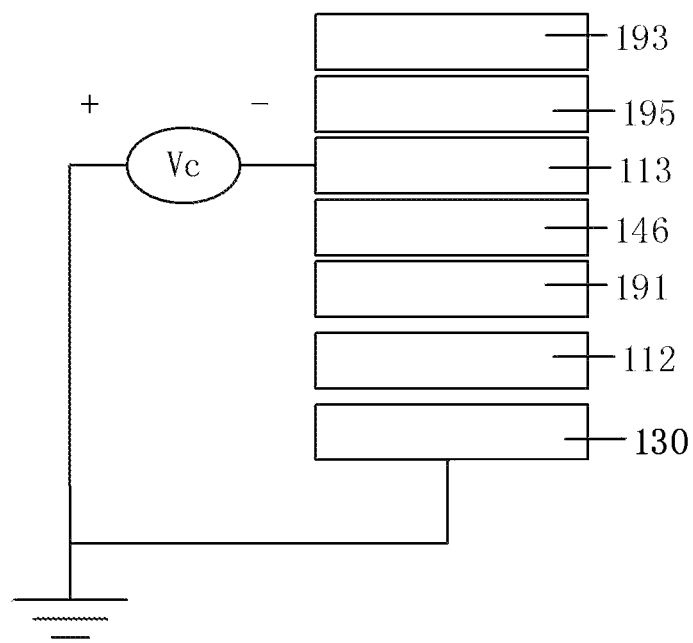
FIG. 21 is another exemplary diagram of a second example of a polarization method provided by at least one embodiment of the present disclosure.

FIG. 21 is another exemplary diagram of a second example of a polarization method provided by at least one embodiment of the present disclosure.

For example, as shown in FIG. 21, in the second example, after all the film layers of the ultrasonic sensor 100 are fabricated, a first voltage (e.g., a ground voltage) may be applied to the first sub-electrode 112 via the backplane 130, and a second voltage (e.g., a negative high voltage) is applied to the second electrode, so the first one-way ON circuit 181 (e.g., a diode) of the pixel unit circuit may be turned on, the first portion 146 is located in the high-voltage electric field, and the first portion 146 is polarized under an action of the high-voltage electric field, so that the first portion 146 is transformed into the first dielectric material layer 111 exhibiting piezoelectric properties, and the second portion 147 is formed into the second electrode layer.

For example, as shown in FIG. 21, the ultrasonic sensor 100 may include a first insulating layer 191, a second insulating layer 192 (not shown in FIG. 21), and a third insulating layer 193. For example, the third insulating layer 193 may be made of SU 8 photoresist and have a thickness of 20 μm.

Figure 22:
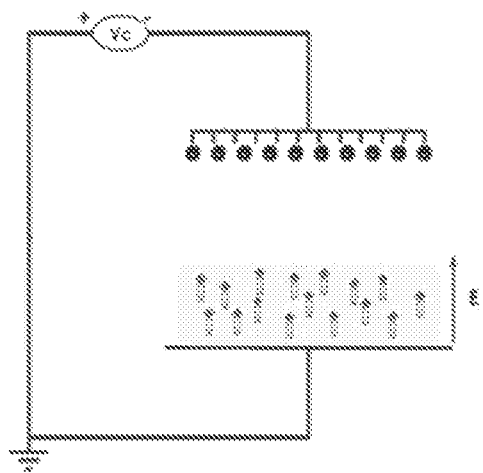
FIG. 22 is a schematic diagram of monitoring quality of a polarization-related parameter provided by at least one embodiment of the present disclosure.

FIG. 22 is a schematic diagram of monitoring quality of a polarization-related parameter provided by at least one embodiment of the present disclosure. For example, as shown in FIG. 22, during or after polarizing at least the first portion 146, quality of the polarization-related parameters may be monitored, so that the polarization degree and piezoelectric strain constant of the first dielectric material layer 111 are closer to design values.

It should be noted that, the second example is not limited to polarizing at least the first portion 146 after all the film layers of the ultrasonic sensor 100 are fabricated; the first portion 146 may be polarized after the second electrode layer of the ultrasonic sensor 100 is formed, and no details will be repeated here.

It should be noted that, for clarity, FIG. 21 only shows the contrast region, and the second insulating layer 192 is not shown.

For example, with respect to the first example and the second example of the preparation method provided by at least one embodiment of the present disclosure, after polarizing at least the first portion 146, the backplane 130 may be cut along the cutting line 161 shown in FIG. 6, to cut away the pads for applying the shield voltage or the pads for applying the first voltage and the second voltage. However, at least one embodiment of the present disclosure is not limited thereto, and in some examples, the pads for applying the shield voltage or the pads for applying the first voltage and the second voltage may also be reserved in a final product of the ultrasonic sensor 100.

Figure 23:
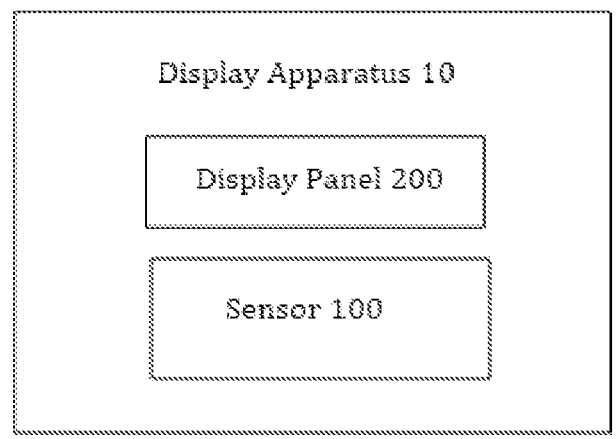
FIG. 23 is an exemplary block diagram of a display apparatus provided by at least one embodiment of the present disclosure.
Figure 24:
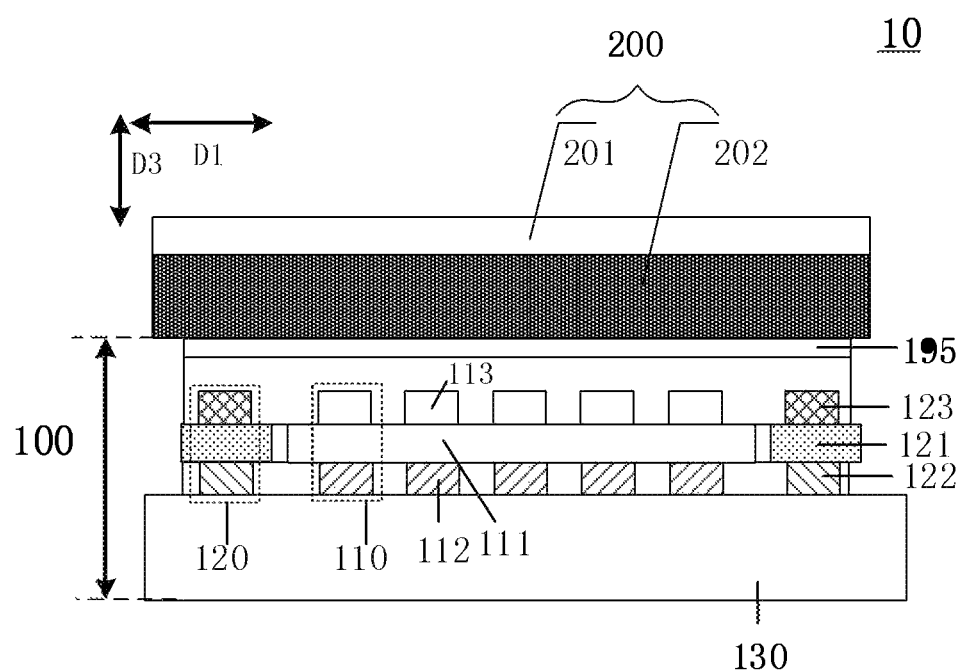
FIG. 24 is a schematic diagram of an exemplary structure of a display apparatus provided by at least one embodiment of the present disclosure.

Some embodiments of the present disclosure further provide a display apparatus; FIG. 23 is an exemplary block diagram of a display apparatus provided by at least one embodiment of the present disclosure; and FIG. 24 is a schematic diagram of an exemplary structure of a display apparatus provided by at least one embodiment of the present disclosure. As shown in FIG. 23 and FIG. 24, the display apparatus provided by the embodiment of the present disclosure includes: a display panel 200 and an ultrasonic sensor 100. The display panel 200 and the ultrasonic sensor 100 are stacked in a direction perpendicular to the display apparatus.

In some examples, a row direction of the ultrasonic sensor 100 corresponds to an extending direction of a gate line of the display panel 200. In other examples, the row direction of the ultrasonic sensor 100 corresponds to an extension direction of a data line of the display panel 200.

For example, the ultrasonic sensor 100 is located on one side of the display panel 200. For example, the one side of the display panel may refer to a display side of the display panel (e.g., a light-emitting side) or a side opposite to the display side of the display panel (e.g., a non-light-emitting side or a side opposite to the light-emitting side). For example, as shown in FIG. 24, the display panel 200 is located on a side of the second sub-electrode 113 that is away from the first sub-electrode 112.

For example, the display panel may include: an Organic Light-Emitting Diode (OLED) display panel, a quantum dot display panel, or a Liquid Crystal Display (LCD) display panel. It should be noted that, FIG. 24 is described by taking an OLED display panel or a quantum dot display panel as an example.

When the display panel is an OLED display panel or a quantum dot display panel, since the OLED display panel or the quantum dot display panel is a self-luminous device, the ultrasonic sensor 100 may be provided on a side opposite to a display side of the OLED display panel.

For example, the OLED display panel includes: an OLED array substrate 202 and a cover plate 201; the OLED array substrate 202 includes a plurality of pixel units; each pixel unit includes an OLED light-emitting device and a pixel circuit for driving the OLED light-emitting device; the OLED light-emitting device includes: an anode, a cathode and an organic light-emitting layer provided between the cathode and the anode; and sealant is provided between the OLED array substrate 202 and the cover plate 201 to seal the OLED light-emitting device on the OLED array substrate in a closed environment.

For example, the cover plate 201 is a flexible cover plate, which may implement flexible foldability of the display panel. For example, the display apparatus further includes: optically clear adhesive (not shown), wherein, the optically clear adhesive is configured to connect the display panel 200 and the ultrasonic sensor 100.

For example, an area of the ultrasonic sensor 100 is equal to an area of a display region of the display panel 200. For example, by making the area of the ultrasonic sensor 100 equal to the area of the display region of the display panel 200, full-screen fingerprint recognition may be implemented. For example, when the display panel 200 further includes a peripheral region surrounding the display region, the area of the ultrasonic sensor 100 may also be greater than the area of the display region of the display panel 200. For example, the above-described area of the ultrasonic sensor 100 refers to a surface area of the ultrasonic sensor 100 parallel to a display surface of the display apparatus; and the above-described area of the display panel 200 refers to a surface area of the display panel 200 parallel to the display face of the display apparatus.

Although the present disclosure is described in detail with general description and specific embodiments above, it is obvious to those skilled in the art that some modifications or improvements can be made on the basis of the embodiments of the present disclosure. Therefore, these modifications or improvements made on the basis of not deviating from the spirit of the present disclosure belong to the scope of protection claimed in the present disclosure.

The above are only exemplary embodiments of the present disclosure and are not used to limit the scope of protection of the present disclosure, which is determined by the appended claims.

The invention claimed is:

1. An ultrasonic sensor, comprising a texture recognition region and a contrast region, wherein,
   the contrast region is located on at least one side of the texture recognition region;
   the texture recognition region comprises at least one recognizing unit, and the contrast region comprises at least one contrast unit;
   the at least one recognizing unit comprises a first dielectric material layer;
   the at least one contrast unit comprises a second dielectric material layer;
   the first dielectric material layer and the second dielectric material layer are made of a same material;
   the first dielectric material layer exhibits piezoelectric properties; and
   a piezoelectric strain constant of the first dielectric material layer is greater than a piezoelectric strain constant of the second dielectric material layer.

2. The ultrasonic sensor according to claim 1, wherein, a ratio of the piezoelectric strain constant of the first dielectric material layer to the piezoelectric strain constant of the second dielectric material layer is greater than or equal to 2.

3. The ultrasonic sensor according to claim 1, wherein, the first dielectric material layer and the second dielectric material layer each comprises a polyvinylidene fluoride film, and the polyvinylidene fluoride film comprised in the first dielectric material layer and the polyvinylidene fluoride film comprised in the second dielectric material layer present different polarization degrees.

4. The ultrasonic sensor according to claim 1, further comprising a backplane,
wherein, an orthogonal projection of the second dielectric material layer on the backplane and an orthogonal projection of the first dielectric material layer on the backplane are spaced apart from each other,
wherein, the contrast region comprises a first contrast sub-region and a second contrast sub-region; and
the first contrast sub-region and the second contrast sub-region are located on both sides of the texture recognition region in a first direction.

5. The ultrasonic sensor according to claim 1, wherein, the at least one recognizing unit further comprises a first sub-electrode and a second sub-electrode;
the first dielectric material layer is sandwiched between the first sub-electrode and the second sub-electrode in a direction perpendicular to the ultrasonic sensor;
the at least one contrast unit further comprises a third sub-electrode and a fourth sub-electrode; and
the second dielectric material layer is sandwiched between the third sub-electrode and the fourth sub-electrode in the direction perpendicular to the ultrasonic sensor.

6. The ultrasonic sensor according to claim 5, wherein, the first sub-electrode and the third sub-electrode are located in a first electrode layer;
the second sub-electrode and the fourth sub-electrode are located in a second electrode layer;
a shape and a size of the first sub-electrode and the third sub-electrode are the same; and
a shape and a size of the second sub-electrode and the fourth sub-electrode are the same.

7. The ultrasonic sensor according to claim 5, further comprising a backplane, a first wiring and a second wiring,
wherein, both the first wiring and the second wiring are electrically connected with the fourth sub-electrode;
the first wiring extends from a position electrically connected with the fourth sub-electrode to an edge of the backplane; and
an orthogonal projection of an end portion of the second wiring on the backplane is spaced apart from the edge of the backplane.

8. The ultrasonic sensor according to claim 7, further comprising a third wiring, a fourth wiring, a fifth wiring and a sixth wiring,
wherein, the third wiring is electrically connected with the first sub-electrode, and the fourth wiring is electrically connected with the third sub-electrode;
the fifth wiring is electrically connected with the first sub-electrode, and the sixth wiring is electrically connected with the third sub-electrode;
the third wiring extends from a position electrically connected with the first sub-electrode to the edge of the backplane; and
the fourth wiring extends from a position electrically connected with the third sub-electrode to the edge of the backplane.

9. The ultrasonic sensor according to claim 5, further comprising a backplane, a seventh wiring and an eighth wiring,
wherein, the seventh wiring is electrically connected with the first sub-electrode, and the eighth wiring is electrically connected with the first sub-electrode;
the seventh wiring extends from the position electrically connected with the first sub-electrode to the edge of the backplane; and
an orthogonal projection of an end portion of the eighth wiring on the backplane is spaced apart from the edge of the backplane.

10. The ultrasonic sensor according to claim 9, wherein, the backplane comprises at least one first pixel unit circuit and at least one second pixel unit circuit;
the at least one first pixel unit circuit is respectively electrically connected with the first sub-electrode of the at least one recognizing unit;
the at least one second pixel unit circuit is respectively electrically connected with the third sub-electrode of the at least one contrast unit;
each of the at least one first pixel unit circuit and the at least one second pixel unit circuit comprises a first voltage input terminal, a voltage output terminal, a driving transistor, and a first one-way ON circuit;
the first one-way ON circuit comprises a first terminal and a second terminal, a conduction direction of the first one-way ON circuit is from the first terminal of the first one-way ON circuit to the second terminal of the first one-way ON circuit;
a control terminal of the driving transistor and the second terminal of the first one-way ON circuit are both electrically connected with the voltage output terminal; and
the first terminal of the first one-way ON circuit and the first voltage input terminal are both electrically connected with a first node;
the voltage output terminal of the at least one first pixel unit circuit is electrically connected with the first sub-electrode;
the driving transistor of the at least one first pixel unit circuit is configured to be electrically connected with the first power terminal and to convert a voltage signal on the first sub-electrode into a current signal;
the voltage output terminal of the at least one second pixel unit circuit is electrically connected with the third sub-electrode;
the at least one first pixel unit circuit further comprises a second voltage input terminal, and the second voltage input terminal of the at least one first pixel unit circuit is electrically connected with the first node;
the seventh wiring is electrically connected with the second voltage input terminal of the at least one first pixel unit circuit; and
the eighth wiring is electrically connected with the first voltage input terminal of the at least one first pixel unit circuit.

11. The ultrasonic sensor according to claim 10, further comprising a second one-way ON circuit and a third one-way ON circuit,
wherein, the second one-way ON circuit comprises a third terminal and a fourth terminal, and a conduction direction of the second one-way ON circuit is from the third terminal of the second one-way ON circuit to the fourth terminal of the second one-way ON circuit;
the third one-way ON circuit comprises a fifth terminal and a sixth terminal, and a conduction direction of the third one-way ON circuit is from the fifth terminal of the third one-way ON circuit to the sixth terminal of the third one-way ON circuit;

the third terminal of the second one-way ON circuit is connected with the first node, and the fourth terminal of the second one-way ON circuit is connected with a second power terminal;

the fifth terminal of the third one-way ON circuit is connected with a third power terminal, and the sixth terminal of the third one-way ON circuit is connected with the first node; and the second voltage input terminal of the at least one first pixel unit circuit is connected with the fifth terminal of the third one-way ON circuit.

12. A display apparatus, comprising a display panel and the ultrasonic sensor according to claim 1, wherein, the display panel and the ultrasonic sensor are stacked in a direction perpendicular to the display apparatus.

13. The display apparatus according to claim 12, wherein, the ultrasonic sensor is located on a non-light-emitting side of the display panel, and the display panel is an organic light-emitting diode display panel or a quantum dot display panel.

14. A preparation method of an ultrasonic sensor, wherein, the ultrasonic sensor comprises a texture recognition region and a contrast region; the contrast region is located on at least one side of the texture recognition region; the texture recognition region comprises at least one recognizing unit; the contrast region comprises at least one contrast unit; the at least one recognizing unit comprises a first dielectric material layer; and the at least one contrast unit comprises a second dielectric material layer;

the method comprises:

forming a first portion for the first dielectric material layer and a second portion for the second dielectric material layer with a same material;

polarizing at least the first portion such that the first portion is transformed into the first dielectric material layer which exhibits piezoelectric properties, and the second portion is formed into the second dielectric material layer, wherein, a piezoelectric strain constant of the first dielectric material layer is greater than a piezoelectric strain constant of the second dielectric material layer.

15. The preparation method of the ultrasonic sensor according to claim 14, wherein, the polarizing at least the first portion comprises:

performing a shielding process on the second portion while polarizing the first portion with a polarizing device, such that a polarization degree of the second portion is less than a polarization degree of the first portion.

16. The preparation method of the ultrasonic sensor according to claim 14, further comprising:

forming a first electrode layer and a second electrode layer, wherein, the first electrode layer comprises a first sub-electrode of the at least one recognizing unit and a third sub-electrode of the at least one contrast unit, and the second electrode layer comprises a second sub-electrode of the at least one recognizing unit and a fourth sub-electrode of the at least one contrast unit; and wherein the forming a first portion for the first dielectric material layer and a second portion for the second dielectric material layer with a same material comprises:

forming a dielectric material layer on the first electrode layer with the same material, wherein, the dielectric material layer is located between the first electrode layer and the second electrode layer and comprises the first portion and the second portion.

17. The preparation method of the ultrasonic sensor according to claim 16, wherein, the polarizing at least the first portion comprises:

placing a laminate of the first electrode layer, the dielectric material layer and the second electrode layer in a polarizing device;

configuring the polarizing device to form plasma to perform a polarization treatment on the first portion; and applying a shield voltage on the fourth sub-electrode to shield the plasma, wherein the shield voltage is 10 V to 30 V.

18. The preparation method of the ultrasonic sensor according to claim 17, wherein, before or while the polarizing device is configured to form the plasma, the shield voltage is applied to the fourth sub-electrode, wherein the shield voltage is 10 V to 30 V.

19. The preparation method of the ultrasonic sensor according to claim 17, wherein, the ultrasonic sensor further comprises a backplane, a first wiring and a second wiring; the first wiring and the second wiring are both electrically connected with the fourth sub-electrode; the first wiring extends from a position electrically connected with the fourth sub-electrode to an edge of the backplane; an orthogonal projection of an end portion of the second wiring on the backplane is spaced apart from the edge of the backplane; and wherein the applying the shield voltage on the fourth sub-electrode comprises:

applying the shield voltage on the fourth sub-electrode with the first wiring, wherein the shield voltage is 10 V to 30 V.

20. The preparation method of the ultrasonic sensor according to claim 16, wherein, the polarizing at least the first portion comprises:

applying a first voltage to the first sub-electrode, applying a second voltage to the second sub-electrode, wherein, a voltage difference between the first voltage and the second voltage is greater than 1000 V.

* * * * *